(12) United States Patent
    Masson

(10) Patent No.: US 11,575,399 B2
(45) Date of Patent: Feb. 7, 2023

(54) NOTCH FILTER WITH SUCCESSIVE WINDOWED INTEGRATIONS, RELATED BAND-PASS FILTERING DEVICE, FREQUENCY DETECTION SYSTEM AND PROCESSING METHOD

(71) Applicant: Commissariat à l'énergie atomique et aux énergies alternatives, Paris (FR)

(72) Inventor: Gilles Masson, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 17/450,574

(22) Filed: Oct. 12, 2021

(65) Prior Publication Data
    US 2022/0123771 A1    Apr. 21, 2022

(30) Foreign Application Priority Data
    Oct. 16, 2020 (FR) .................................. 20 10662

(51) Int. Cl.
    *H04B 1/10* (2006.01)
(52) U.S. Cl.
    CPC ... *H04B 1/1036* (2013.01); *H04B 2001/1054* (2013.01); *H04B 2001/1063* (2013.01)
(58) Field of Classification Search
    CPC ........... H03H 2011/0488; H03H 11/04; H03H 11/0422; H03H 11/0466; H03H 17/0291; H04B 1/1036; H04B 2001/1054; H04B 2001/1063
    See application file for complete search history.

(56) References Cited

U.S. PATENT DOCUMENTS

| 6,268,766 B1 * | 7/2001 | Thomasson ........ H03H 11/1217 330/306 |
| 9,407,482 B2 | 8/2016 | Aggarwal et al. |
| 2008/0007326 A1 | 1/2008 | Iida |
| 2009/0134938 A1 | 5/2009 | Iida et al. |

(Continued)

OTHER PUBLICATIONS

French Preliminary Search Report dated Jun. 22, 2021 in French Application 20 10662 filed on Oct. 16, 2020, 3 pages (with English Translation of Categories of Cited Documents).

(Continued)

*Primary Examiner* — David S Huang
(74) *Attorney, Agent, or Firm* — Oblon, McClelland, Maier & Neustadt, L.L.P.

(57) ABSTRACT

This electronic notch filter is able to receive an input signal and deliver a filtered signal having an amplitude, at a cut-off frequency, that is attenuated with respect to that of the input signal.

It comprises a module for integrating the input signal during several successive time windows, each time window starting at a respective initial time instant and having a duration substantially equal to the inverse of the cut-off frequency, the initial temporal time instants of at least two distinct windows being separated by a temporal shift of a value greater than or equal to a predefined reference duration, each integration of the input signal during a respective temporal window resulting in a respective intermediate signal; and a module for summing the intermediate signals coming from the integration module; the filtered signal depending on the sum of said intermediate signals.

41 Claims, 17 Drawing Sheets

(56) References Cited

U.S. PATENT DOCUMENTS

| | | |
|---|---|---|
| 2012/0063555 A1 | 3/2012 | Pullela et al. |
| 2015/0133068 A1 | 5/2015 | Aggarwal et al. |
| 2015/0333785 A1 | 11/2015 | Pullela et al. |
| 2017/0331504 A1 | 11/2017 | Pullela et al. |
| 2020/0052730 A1 | 2/2020 | Pullela et al. |

OTHER PUBLICATIONS

Darvishi et al., "Widely Tunable 4th Order Switched $G_m$-C Bandpass Filter Based on N-path Filters", IEEE, 2012, 15 pages.
Hasan et al., "Tunable N-Path RF Front-end Filter with an Adaptive Integrated Notch for FDD/Co-Existence", IEEE, 2012, 4 pages.

* cited by examiner

NOTCH FILTER WITH SUCCESSIVE WINDOWED INTEGRATIONS, RELATED BAND-PASS FILTERING DEVICE, FREQUENCY DETECTION SYSTEM AND PROCESSING METHOD

CROSS-REFERENCE TO RELATED APPLICATIONS

This application is a U.S. non-provisional application claiming the benefit of French Application No. 20 10662, filed on Oct. 16, 2020, which is incorporated herein by reference in its entirety.

FIELD

The present invention relates to an electronic notch filter able to receive an input signal and to deliver a filtered signal having an amplitude, at a cut-off frequency, that is attenuated with respect to that of the input signal.

The invention also relates to an electronic band-pass filtering device comprising such an electronic notch filter, a frequency detection system comprising such an electronic band-pass filtering device, a radio receiver comprising such a frequency detection system and a related method for processing a digital signal implemented by computer.

The invention relates to the field of electronic filters for attenuating an input signal, particularly within a notch filter frequency band, or outside a frequency band for a band-pass filter.

The invention also relates to the field of radio frequency reception, and in particular to the use of such electronic filters in radio frequency reception. The intended applications are for selectively detecting the presence of a radio frequency wave from among other waves, for example, and/or for decoding the information carried by a radio frequency wave with amplitude, frequency and phase coding, for example.

BACKGROUND

A notch filter of the above-mentioned type, also called a band-stop filter or band-reject filter, is known, with such a filter aiming to prevent the passage of a range of signal frequencies, typically around a predefined frequency, called the cut-off frequency.

An electronic band-pass filtering device of the type mentioned above, also called a band-pass filter, is also known, with such a filter aiming to keep only a band of signal frequencies around a target frequency, and to prevent the passage of the signal outside this frequency band.

U.S. Pat. No. 9,407,482 B2 and the paper "*Tunable N-Path RF Front-end Filter with an Adaptive Integrated Notch for FDD/Co-Existence*" by Hasan, IEEE 2012, presents a selective i.e. high rejection band-pass filter architecture via a combination of a band-pass filter and a band-stop filter, to achieve better selectivity. The band-pass and band-stop filters used are switched-capacitor filters, also called N-path filters, where N is the number of switches in parallel.

Such an architecture with the combination of these two filters enables improved rejection of the filter in a precise frequency, close to the band-pass filter frequency.

The paper "*Widely Tunable $4^{th}$ Order Switched Gm-C Band-Pass Filter Based on N-Path Filters*" by Darvishi, IEEE 2012, also presents a high rejection band-pass filter architecture via the combination of two frequency-shifted, second-order band-pass filters, to obtain a fourth-order band-pass filter. The band-pass filters used are also N-path filters.

However, N-path filters have drawbacks that limit their performance in terms of clock generation with a limitation in the frequency of the clocks used to subdivide the period of the signal to be detected, and the need for the clocks to be non-overlapping so as not to degrade selectivity, gain and linearity, which further reduces their period of activity and increases the complexity, inaccuracy and mismatch, thus degrading the performance of such a filter. This performance limitation also translates into insertion losses, as the resistance of the switches limits out-of-band rejection.

This resistance can be reduced by increasing the number N of switches in parallel, but this is done at the expense of an increase in power consumption and a reduction in the maximum operating frequency. These performance limitations also relate to the selectivity linked to the filtering capacity, on the one hand, which must be increased, and linked to the order of the filter on the other hand, which is intrinsically limited to the order 2.

To increase the order of the filter, and thus its selectivity, it is necessary to cascade multiple N-path filters, for example, as described in Darvishi's paper, but this also leads to an increase in power consumption and a limitation of the frequency of use.

In addition, these band-pass filter architectures require the integration of an input splitter, to direct the input signal to the two filters used in combination, and also an output combiner, to combine the filtered signals from each of the filters. These separators and combiners further limit the performance of the band-pass filter, and also generate additional power consumption.

SUMMARY

The object of the invention is thus to propose an electronic notch filter and related electronic band-pass filtering device that enables the power consumption to be reduced while being selective and providing high rejection.

To this end, the subject matter of the invention is an electronic notch filter of the above type, comprising:
 an integration module, configured to integrate the input signal during multiple successive time windows, each time window starting at a respective initial time instant and having a duration substantially equal to the inverse of the cutoff frequency, the initial time instants of at least two distinct windows being separated by a time shift of a value greater than or equal to a predefined reference duration, such as the inverse of the cutoff frequency, each integration of the input signal during a respective time window resulting in a respective intermediate signal,
 a summing module, connected to the output of the integration module and configured to add the intermediate signals from the integration module, the filtered signal depending on the sum of said intermediate signals.

Thus, the electronic notch filter according to the invention is able to filter the input signal into only a few input signal periods, which makes it possible to limit the power consumption and to provide better throughput, while continuing to provide high selectivity.

In addition, the initial time instants of the successive time windows are capable of being generated with control clocks that have activity periods of the order of the cutoff frequency period. This thus allows this cutoff frequency value to be increased and the notch filter according to the invention to be used in the application of radio frequency filtering of a radio receiver, in particular the application off radio frequency channel filtering, also called RF channel filter, i.e. a direct radio frequency filter application, typically before down-conversion to a lower frequency.

In other advantageous aspects of the invention, the electronic notch filter comprises one or more of the following features, taken alone or in any technically possible combination:

the integration module is configured to integrate the input signal during No first successive time windows, then during Nb second successive time windows, with No and Nb each being an integer greater than or equal to 2, the initial time instants of the No first windows all included in a first time period of duration substantially equal to the reference duration, and the initial time instants of the Nb second windows all subsequent to the first time period;

the initial time instants of the No first windows preferably being regularly distributed during the first time period;

the initial time instants of the Nb second windows preferably being regularly distributed during a second time period, subsequent to the first time period;

the second time period more preferably being substantially equal in duration to the reference period;

a transfer function module associated with the integration of the input signal during a respective time window satisfies the following equation:

$$|G(f)| = \frac{\sqrt{2(1-\cos(2\pi f T_{int}))}}{\frac{f}{F_{int}}}$$

where G represents the gain and f the frequency,
$T_{int}$ represents the duration of the respective time window; and
$F_{int}$ satisfies the following equation:

$$F_{int} = \frac{g_m}{2\pi C_{int}}$$

with $g_m$ representing a transconductance of the integration, and.
$C_{int}$ representing a capacitance of the integration;

the integration module comprises at least one integration unit, each integration unit being connected to the input of the summing module and configured to integrate the input signal during at least one time window;

the integration module preferably comprising several integration units arranged in parallel with each other, each configured to integrate the input signal during a respective time window;

the summing module is a digital module, and the integration module comprises at least one analog-to-digital converter, the input signal being an analog signal;

each integration unit preferably comprising an analog conversion stage, an averaging stage and an analog-to-digital converter, and an analog-to-digital converter with successive approximation register preferably also forming the averaging stage and the analog-to-digital converter; and the integration module and the summing module are each an analog module, the input signal being an analog signal.

The subject matter of the invention is also an electronic band-pass filtering device able to receive an input signal and deliver an output signal, having an amplitude, outside of a frequency band centered around a target frequency, that is attenuated with respect to that of the input signal, the device comprising:

a first notch filter able to receive the input signal and deliver a first filtered signal having an amplitude, at a first cut-off frequency, attenuated with respect to that of the input signal, the first cut-off frequency being substantially equal to the target frequency, a second notch filter able to receive the input signal and deliver a second filtered signal having an amplitude, at a second cutoff frequency, that is attenuated with respect to that of the input signal, the second cutoff frequency being distinct from the first cutoff frequency, the second cutoff frequency being strictly lower or strictly higher than the target frequency, a generation module, connected to the output of the first and second notch filters and configured to generate the output signal from a combination of the first and second filtered signals, at least one and preferably each of the first and second notch filters being as defined above.

This band-pass filter device according to the invention has the advantages described above for the notch filter according to the invention, with at least one and preferably each of the first and second notch filters being a notch filter as defined above.

Furthermore, due to the two distinct channels corresponding to the first notch filter and the second notch filter respectively, the band-pass filter device according to the invention requires neither an input splitter, with the band-pass filter device having a sufficiently high input impedance, nor an output combiner, when the output signal from the combination of the first and second filtered signals is generated digitally. This thus allows the power consumption to be reduced further, and also makes it possible to have an electronic circuit for implementing said band-pass filtering device with a smaller area occupied.

The invention also concerns an electronic band-pass filtering device, able to receive an input signal and deliver an output signal having an amplitude, outside a frequency band centered around a target frequency, that is attenuated with respect to that of the input signal, the device comprising:

a notch filter, able to receive the input signal and deliver a filtered signal having an amplitude, at a cut-off frequency, that is attenuated with respect to that of the input signal;

a control module configured to:

control the notch filter with the cutoff frequency equal to one of a first cutoff frequency and a second cutoff frequency, and store the resulting signal as one of a first filtered signal related to the first cutoff frequency and a second filtered signal related to the second cutoff frequency, the first cutoff frequency being substantially equal to the target frequency, the second cutoff frequency being distinct from the first cutoff frequency, the second cutoff frequency being either strictly less than or strictly greater than the target frequency; and then drive the notch filter with the cutoff frequency equal to the other of the first cutoff frequency and the second cutoff frequency, to obtain the other of the first filtered signal and the second filtered signal, a generation module connected to the output of the control module and configured to generate the output signal from a combination of the first and second filtered signals the notch filter being as defined above.

According to other advantageous aspects of the invention, the electronic band-pass filter device comprises one or more of the following features, taken alone or in any technically possible combination:

the second cut-off frequency is substantially equal to two thirds of the target frequency or substantially equal to twice the target frequency;

the predefined reference duration is equal to the inverse of the target frequency; and the combination of the first and second filtered signals is a linear combination, the linear combination of the first and second filtered signals preferably satisfying the following equation:

$$Ys=E2-K \cdot E1$$

where Ys represents the output signal,
E1 represents the first filtered signal,
E2 represents the second filtered signal,
K is an integer greater than or equal to 1;
K is preferably a power of 2 and is written as:

$$K=2^P$$

with P a positive integer.

The invention also concerns a frequency detection system, for a radio receiver in particular, the system comprising:

an electronic band-pass filtering device, able to receive an input signal and deliver an output signal, having an amplitude, outside a frequency band centered around a target frequency, that is attenuated with respect to that of the input signal, and an electronic control device, able to vary the value of the target frequency of the band-pass filtering device until a characteristic frequency of the input signal is detected, the characteristic frequency thus corresponding to the current value of the target frequency, the electronic band-pass filtering device being as defined above.

The invention also concerns a radio receiver comprising a frequency detection system, with the frequency detection system being defined as above.

The invention also concerns a method for processing an input digital signal, with the input digital signal able to be supplied by an analog-to-digital converter connected to the output of a sensor able to receive an analog input signal, the method being implemented by computer and comprising:

a step of notch filtering the input digital signal into a filtered digital signal, with the filtered digital signal having an amplitude, at a cutoff frequency, that is attenuated with respect to that of the input digital signal, the notch filtering step comprising:

an integration of the input digital signal during multiple successive time windows, each time window starting at a respective initial time instant and having a duration substantially equal to the inverse of the cutoff frequency, the initial time instants of at least two distinct windows being separated by a time shift of a value greater than or equal to a predefined reference duration, such as the inverse of the cutoff frequency, with each integration of the input digital signal during a respective time window resulting in a respective intermediate digital signal; and a summing of the intermediate digital signals, with the filtered digital signal depending on the sum of said intermediate digital signals.

According to other advantageous aspects of the invention, the processing method comprises one or more of the following features, taken alone or in any technically possible combination:

the method comprises a process of band-pass filtering the input digital signal into an output digital signal, with the output digital signal having an amplitude, outside a frequency band centered around a target frequency, that is attenuated with respect to that of the input digital signal, the band-pass filtering process comprising:

initial implementation of the notch filtering step with the cutoff frequency equal to one of a first cutoff frequency and a second cutoff frequency, the first cutoff frequency being substantially equal to the target frequency, the second cutoff frequency being distinct from the first cutoff frequency, the second cutoff frequency being strictly less than or strictly greater than the target frequency, a step of storing the signal obtained from among a first filtered digital signal related to the first cutoff frequency and a second filtered digital signal related to the second cutoff frequency, and subsequent implementation of the notch filtering step with the cutoff frequency equal to the other of the first cutoff frequency and the second cutoff frequency, in order to obtain the other signal from among the first filtered digital signal and the second filtered digital signal, a step of generating the output digital signal from a combination of the first and second filtered digital signals.

the method comprises several iterations of the band-pass filtering process for different successive values of the target frequency until a characteristic frequency of the input signal is detected, the characteristic frequency thus corresponding to a current value of the target frequency.

BRIEF DESCRIPTION OF THE DRAWINGS

These features and advantages of the invention will become clearer upon reading the following description, given only as a non-limiting example, and made with reference to the appended drawings, in which.

DETAILED DESCRIPTION

The term "substantially equal to", as used in this description, defines a relationship of equality plus or minus 10%, preferably plus or minus 5%.

Figure 1:
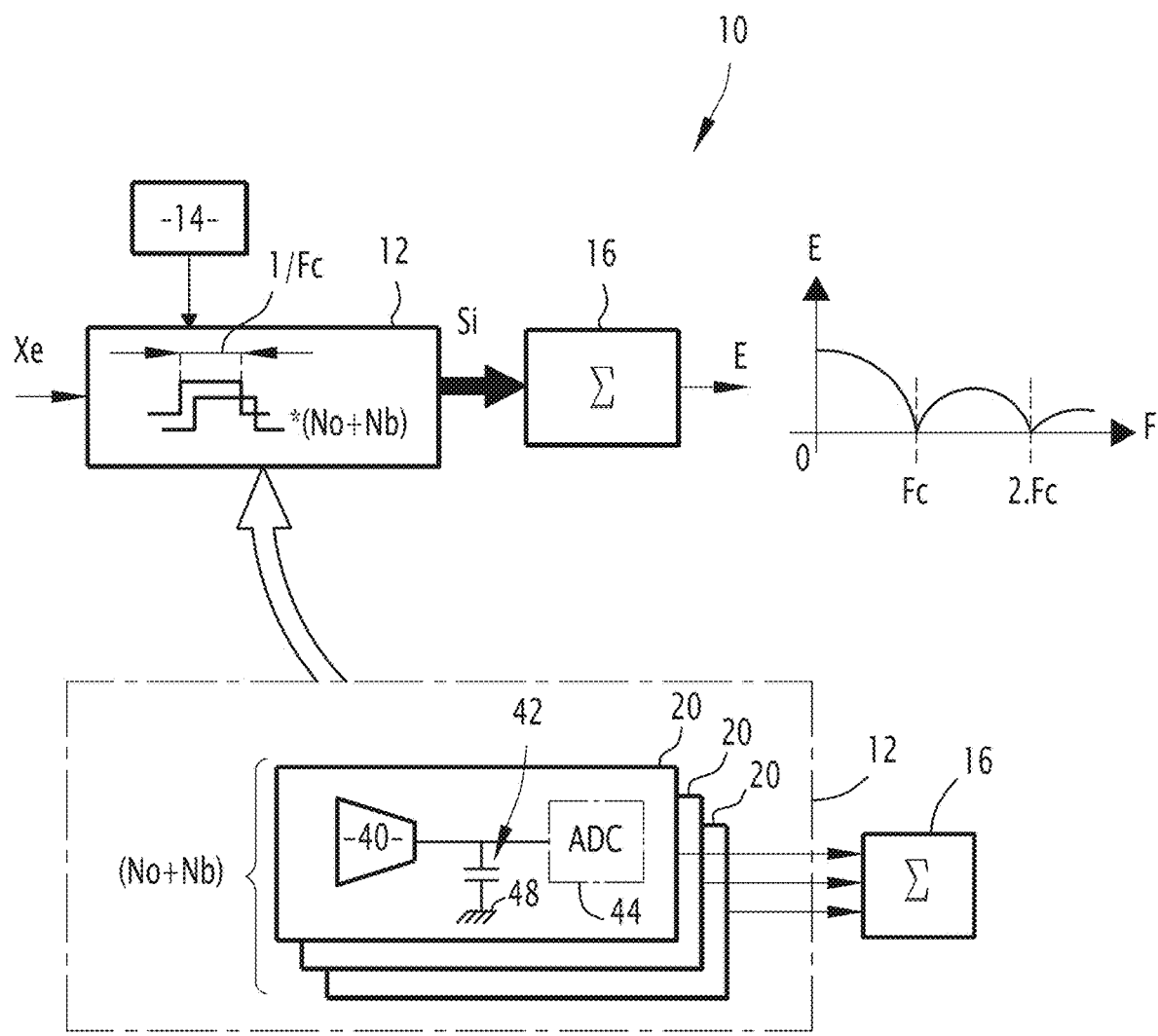
FIG. 1 is a schematic representation of an electronic notch filter according to the invention, the notch filter comprising a module for integrating an input signal during several successive time windows, a module for generating clock edges corresponding to initial and final time instants of the successive time windows, and a summing module connected to the output of the integration module.

In FIG. 1, an electronic notch filter 10 is adapted to receive an input signal Xe and to deliver a filtered signal E having an amplitude, at a cutoff frequency Fc, that is attenuated with respect to that of the input signal Xe. This attenuation at the cut-off frequency Fc is illustrated by the schematic curve visible in FIG. 1, representing the filtered signal E as a function of the frequency F.

The notch filter 10 is also called a band-stop filter or band-reject filter, and, as known per se, is also able to attenuate the amplitude of the input signal Xe for multiples of the cut-off frequency Fc, as shown on the curve of the filtered signal E with the frequency amplitude attenuations equal to Fc and 2Fc.

The notch filter 10 comprises a module 12 for integrating the input signal during multiple successive time windows W1, W2, with each time window W1, W2 having a duration substantially equal to the inverse of the cutoff frequency Fc, and each integration of the input signal Xe during a respective time window W1, W2 resulting in a respective intermediate signal Si.

The notch filter 10 comprises a module 14 for generating clock edges corresponding to the respective initial and final time instants of the successive time windows W1, W2, with the generation module 14 being connected to the integration module 12. In a variant not shown, the generation module is integrated into the integration module 12.

The notch filter 10 comprises a module 16 for summing the intermediate signals Si from the integration module 12, the summing module 16 being connected to the output of the integration module 12.

Figure 2:
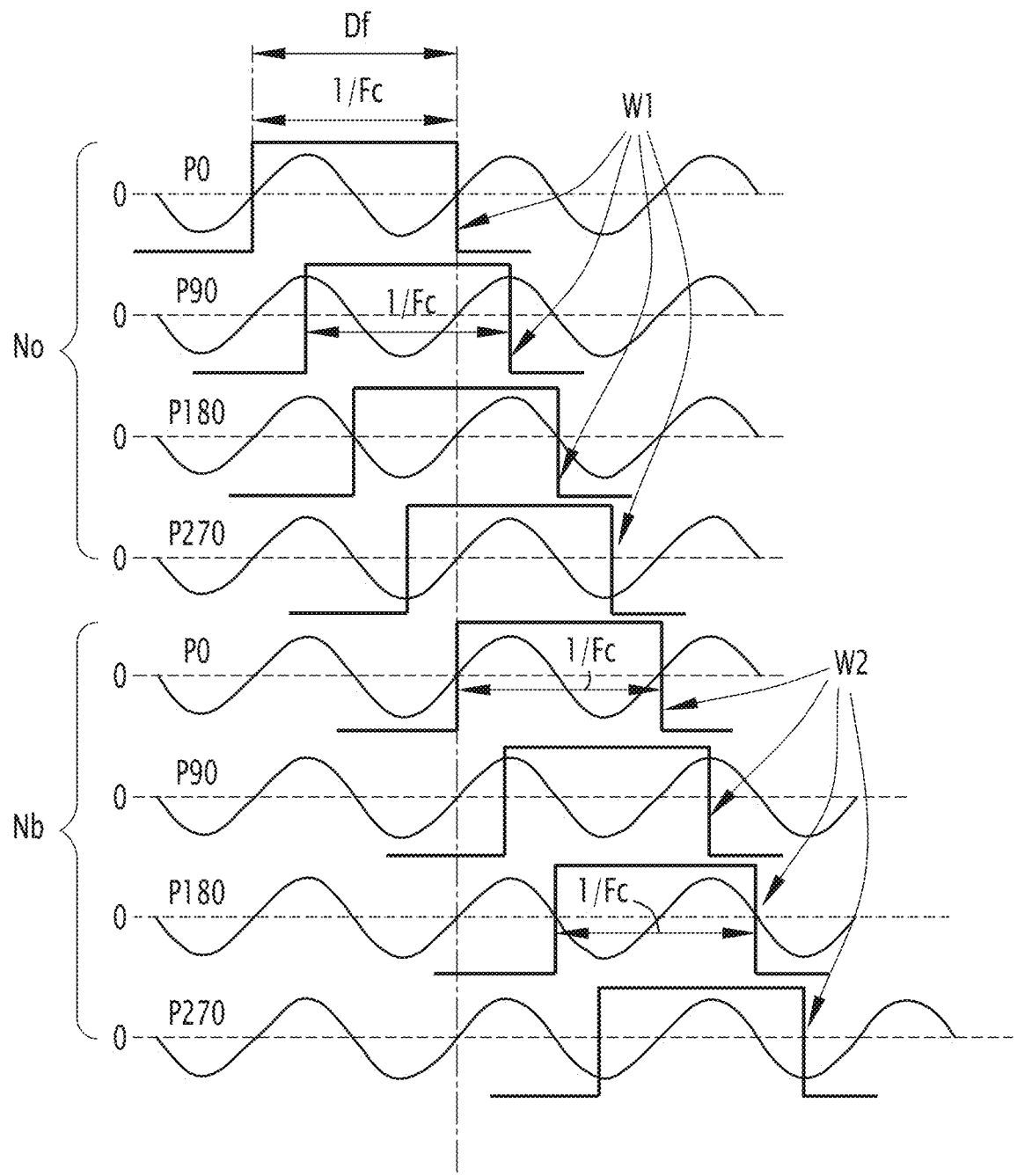
FIG. 2 is a schematic representation of the successive time windows implemented by the integration module of FIG. 1.
Figure 3:
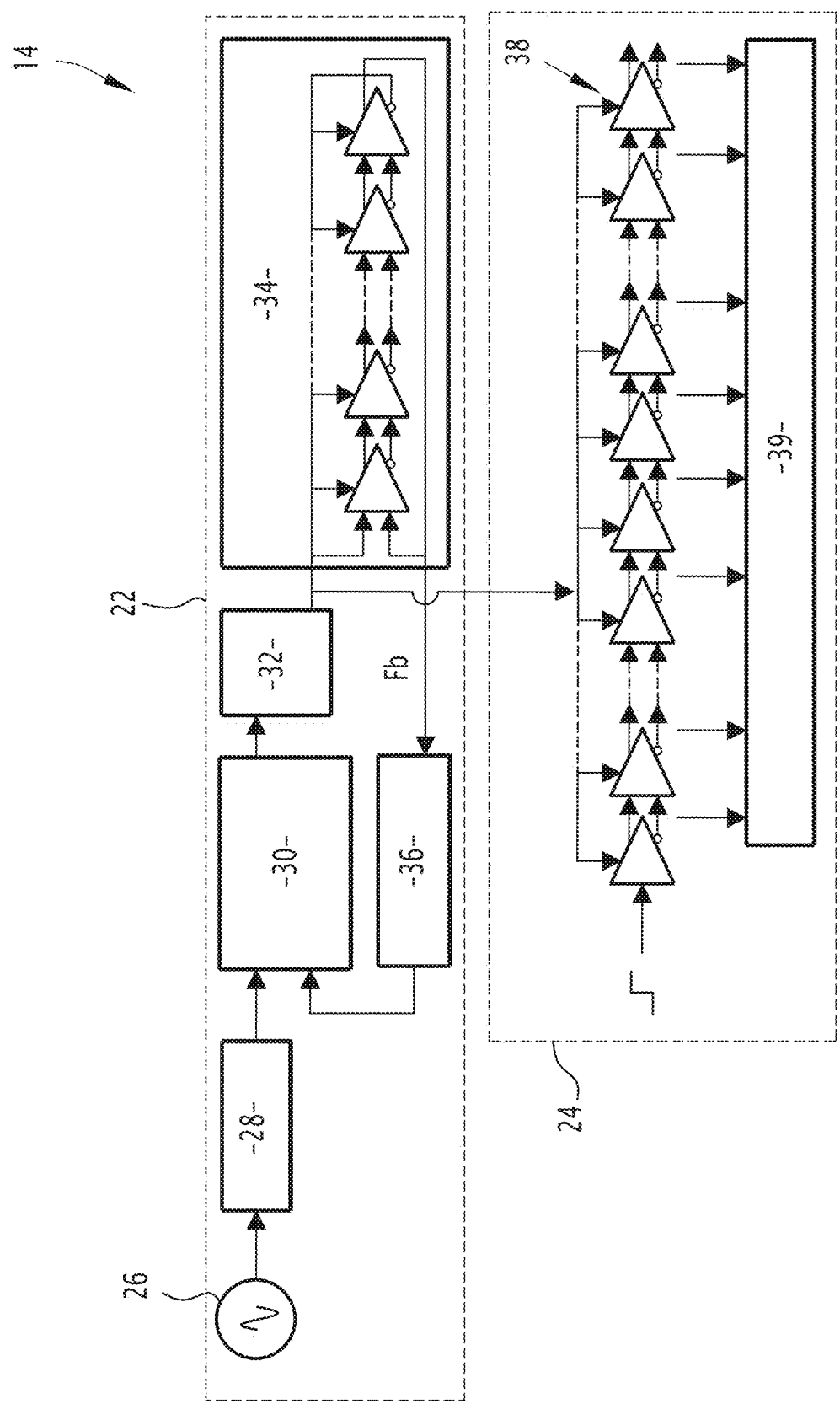
FIG. 3 is a schematic representation of the generation module of FIG. 1.

The integration module 12 is configured to perform an integration of the input signal Xe during successive time windows W1, W2, visible in FIG. 2, each time window W1, W2 starting at a respective initial time instant and having a duration substantially equal to the inverse of the cutoff frequency Fc.

The integration module 12 is further configured to temporally shift the time windows W1, W2 with respect to each other, with the initial time instants thus being shifted with respect to each other, and with the initial time instants of at least two distinct time windows W1, W2 further being separated by a time shift of a value greater than or equal to a predefined reference duration Df, such as the inverse of the cutoff frequency Fc.

In the example of FIG. 2, the integration module 12 is configured to integrate the input signal during No first successive time windows W1, marked by the bracket No, then during Nb second successive time windows W2, marked by the bracket Nb.

The numbers No and Nb are each an integer greater than or equal to 2, preferably between 3 and 5, and more preferably equal to 4. In the example shown in FIG. 2, the numbers No and Nb are both equal to 4.

The inventors have observed that the higher the No and respective Nb value, the higher the accuracy of the notch filter 10 will be. The person skilled in the art will note, however, that the higher this No value and respective Nb number, the longer the duration of implementation of the notch filter 10 and, moreover, the higher the power consumption or the surface area occupied by an electronic circuit for implementing said filter 10. The value equal to 4 for No and Nb is therefore a good compromise between precision on the one hand, and power consumption on the other.

In the example of FIG. 2, the numbers No of the first windows W1 and Nb of the second windows W2 are equal. In a variant, not shown, the numbers No and Nb are different.

The initial time instants of No first windows W1 are all included in a first time period, of duration substantially equal to the reference duration Df, and the initial time instants of Nb second windows W2 are all later than the first time period. In the example of FIG. 2, the predefined reference duration Df is equal to the inverse of the cutoff frequency Fc.

The initial window, among the No first time windows W1, is separated by a time shift equal to the predefined reference duration Df with the initial window among the Nb second time windows W2, these two windows thus typically corresponding to the two aforementioned windows separated by the time shift of value greater than or equal to the predefined reference duration Df. The same is true between the respective successive windows of the No first time windows W1 and those of the Nb second time windows W2, in the example of FIG. 2.

The person skilled in the art will understand that the first time period in the example of FIG. 2 typically corresponds to the period starting at an initial time instant of the initial window among the No first time windows W1 and ending at that instant plus the reference duration Df. In other words, the first time period typically corresponds to the period of the initial window from among the No first time windows W1.

As an optional addition, the initial time instants of the No first windows W1 are evenly distributed over the first time period. In the example of FIG. 2, the No first time windows W1 correspond to phase shifts equal to 0°, 90°, 180° and 270° respectively and noted P0, P90, P180 and P270, respectively. These phase shifts correspond thus to the said regular distribution of the initial time instants, since the shift from one time instant to the other corresponds to a phase shift of 90°, that is, 360°/No with No equal to 4.

As a further optional addition, the initial temporal time instants of the Nb second windows W2 are all included in a second temporal period of duration substantially equal to the reference duration Df and subsequent to the first temporal period.

According to this optional addition, the initial time instants of the Nb second windows W2 are also preferably evenly distributed over the second time period. In the example of FIG. 2, the initial time instants of the Nb second windows W2 thus correspond to phase shifts equal to 0°, 90°, 180° and 270° respectively, and noted P0, P90, P180 and P270 respectively. In a similar way to the No first windows W1, the person skilled in the art will thus observe that these phase shifts correspond to a regular distribution of the initial temporal time instants of the Nb second windows W2, the shift being equal to 90° between two successive initial time instants, that is, 360°/Nb with Nb equal to 4.

The second time period typically corresponds to the period starting at the initial time instant related to the initial window from among the Nb second time windows W2 and ending at this instant plus the reference duration Df. In other words, the second time period typically corresponds to the period of the initial window from among the Nb second time windows W2.

The integration module 12 is configured integrate the input signal Xe during a respective time window W1, W2, for example, such that a transfer function for said integration has a module satisfying the following equation:

$$|G(f)| = \frac{\sqrt{2(1 - \cos(2\pi f T_{int}))}}{\frac{f}{F_{int}}} \quad \text{[Math 1]}$$

where G represents the gain and f the frequency,
$T_{int}$ represents the duration of the time window W1, W2; and
$F_{int}$ satisfies the following equation:

$$F_{int} = \frac{g_m}{2\pi C_{int}} \quad \text{[Math 2]}$$

with $g_m$ representing a transconductance of the integration, and.
$C_{int}$ representing a capacitance of the integration.

The person skilled in the art will thus understand that the integration module 12 is configured to obtain an average value of the input signal Xe over a respective time window W1, W2 via said integration of the input signal Xe during that respective time window W1, W2. In other words, the integration module 12 forms a windowed average during each of the successive time windows W1, W2.

The integration module 12 comprises at least one integration unit 20, with each integration unit 20 connected to the input of the summing module 16 and configured to integrate the input signal Xe during at least one time window W1, W2.

Preferably, the integration module 12 comprises multiple integration units 20 arranged in parallel with each other, each configured to integrate the input signal Xe during a respective time window W1, W2.

Even more preferably, the number of integration units 20 is equal to the total number of successive time windows W1, W2, related to the integration module 12. In the example of FIGS. 1 and 2, the integration module 12 thus comprises No+Nb separate integration units 20 arranged in parallel with each other.

This parallel arrangement of the integration units 20 thus makes it possible to make parallel the operations required to integrate the input signal Xe during the multiple successive time windows W1, W2 and to thus achieve faster filtering of the input signal Xe.

In a variant, the integration module 12 comprises a single integration unit 20 for integrating the input signal Xe during the multiple successive time windows W1, W2.

The generation module 14 is configured to generate clock edges corresponding to the initial and final time instants of successive time windows W1, W2.

The generation module 14 is thus typically configured to generate clock edges corresponding to the initial time instants of the successive time windows W1, W2, and other clock edges corresponding to the final time instants of the time windows W1, W2.

The generation module 14 comprises a frequency synthesis unit 22 and an edge replication unit 24, for example. The frequency synthesis unit 22 is also referred to as a Phase-Locked Loop (PLL) unit, which is configured to implement a phase-locked loop. Typically, the frequency synthesis unit 22 comprises a reference oscillator 26 connected to the input of a reference divider 28, itself connected to the input of a block 30 comprising a phase comparator, also called Phase Frequency Detector (PFD) and a charge pump. The frequency synthesis unit 22 also includes a loop filter 32 connected to the output of the block 30 and a ring oscillator 34 connected to the output of the loop filter 32, the ring oscillator 34 comprising No phases. Finally, the frequency synthesis unit 22 includes a loop splitter 36 connected to the output of the ring oscillator 34 and forming a loop back to the block 30 comprising the phase comparator and the charge pump, by being connected to the input of said block 30.

The person skilled in the art will thus understand that the frequency synthesis unit 22 is based on the phase-locked loop containing the ring oscillator 34 with No phases, the phase-locked loop receiving a reference frequency—from the reference oscillator 26—which is thus divided by the reference divider 28 before being compared by the phase comparator of the block 30 to a base frequency Fb coming from the ring oscillator 34 and itself divided by the loop divider 36. The charge pump of the block 30 integrates the phase difference, and the loop filter 32 connected between the block 30 and the ring oscillator 34 is used to stabilize the loop and to provide a voltage set point to the ring oscillator 34. This voltage set point is used to adjust the cell delay of the ring oscillator 34, in order to converge towards the target base frequency Fb.

The edge replication unit 24 comprises a set 38 of replicated cells of the ring oscillator to generate in No+Nb+Na phases and an edge combining stage 39 able to supply the clock edges to the integration module 12.

The person skilled in the art will thus understand that the assembly 38 comprises No+Nb+Na delay cells that are identical to the cells constituting the ring oscillator 34 of the frequency synthesis unit 22 and hence enable the control clocks for the integration module 12 to be generated. The number Na of additional phases arises from the fact that a number of edges greater than the number No+Nb of time windows W1, W2 is required to construct the edges of the control clocks corresponding to the final time instants of the time windows W1, W2.

The person skilled in the art will observe that the voltage set point from the loop filter 32 and supplied to the ring oscillator 34 is also used in delay line control for the replicated cell set 38, in order to generate all the clock phases necessary to generate the clocks for the integration module 12. The combining stage 39 is thus able to receive the clock phases and generating all the clock edges for the integration module 12 at its output, by combinational logic.

The person skilled in the art will thus note that the base frequency Fb referred to, such as the cutoff frequency Fc for the notch filter 10, is easily modifiable with the generation module 14, since it is sufficient for this purpose to modify a division rank of the loop divider 36, or even also a division rank of the reference divider 28.

The generation module 14 can thus easily reconfigure the value of the base frequency Fb used by the integration module 12, such as the cutoff frequency Fc for the notch filter 10.

Indeed, a change in the division rank of the loop divider 36, or even that of the reference divider 28, results in an automatic adjustment of the frequency of the ring oscillator 34, as well as of all the phases of the replicated cell delay line, followed by the clocks generated by the combining stage 39.

The summing module 16 is configured to add up the intermediate signals Si from the integration module 12 and to provide the filtered signal E at its output, the filtered signal E depending on the sum of said intermediate signals Si. The summing module 16 is configured in particular to perform an unsigned summing of the intermediate signals Si, i.e. an unsigned accumulation of the intermediate signals Si.

The summing module 16 is a digital module when the intermediate signals Si from the integration module 12 are digital signals, said intermediate digital signals being thus noted Di. In a variant, the summing module 16 is an analog module when the intermediate signals Si from the integration module 12 are analog signals, said intermediate analog signals being thus noted Ai.

Each integration unit 20 comprises an analog conversion stage 40 connected to the input of an averaging stage 42, for example. When the integration unit 20 is configured to output an intermediate digital signal Di, the integration unit 20 further comprises an analog-to-digital converter 44 connected to the output of the averaging stage 42.

As an optional addition, the averaging stage 42 and the analog-to-digital converter 44 are preferably implemented with an analog-to-digital converter with a successive approximation register 46, also referred to as SAR-ADC 46 (Successive Approximations Register—Analog to Digital Converter).

The successive approximation register with analog-to-digital converter 46 typically comprises a digital-to-analog converter with one input and one output, a comparator with two inputs and one output, one input connected to the output of the digital-to-analog converter and the other input adapted to receive a reference signal, and a successive approximation register logic unit connected to the output of the comparator, the successive approximation register logic unit adapted to control the digital-to-analog converter. The digital-to-analog converter also contains a capacitor array, also called a capacitor comb.

According to this optional addition, the capacitor array of the analog-to-digital converter with a successive approximation register 46 fulfills a double function, namely its usual function within a successive approximation register with analog-to-digital converter, i.e. a holding function, i.e. a memorization function, during the sampling phase of the successive approximation register with analog-to-digital converter 46, and, in addition, an averaging function, i.e. an integration function, the capacitor array thus forming the averaging stage 42.

According to this optional addition, the person skilled in the art will thus understand that the integration of the input signal Xe during the respective time window W1, W2 is carried out together with the analog-to-digital conversion, which thus makes it possible to provide an even more compact notch filter 10 with even lower latency.

The analog conversion stage 40 is configured to perform a voltage-to-current conversion during the respective time window W1, W2, and takes the form of a transimpedance cell, for example.

The averaging stage 42 is configured to perform an averaging of the signal from the conversion stage 40 during the respective time window W1, W2, and typically comprises a set of capacitors arranged in parallel and connected between the output of the conversion stage 40 and an electrical ground 48.

Figure 4:
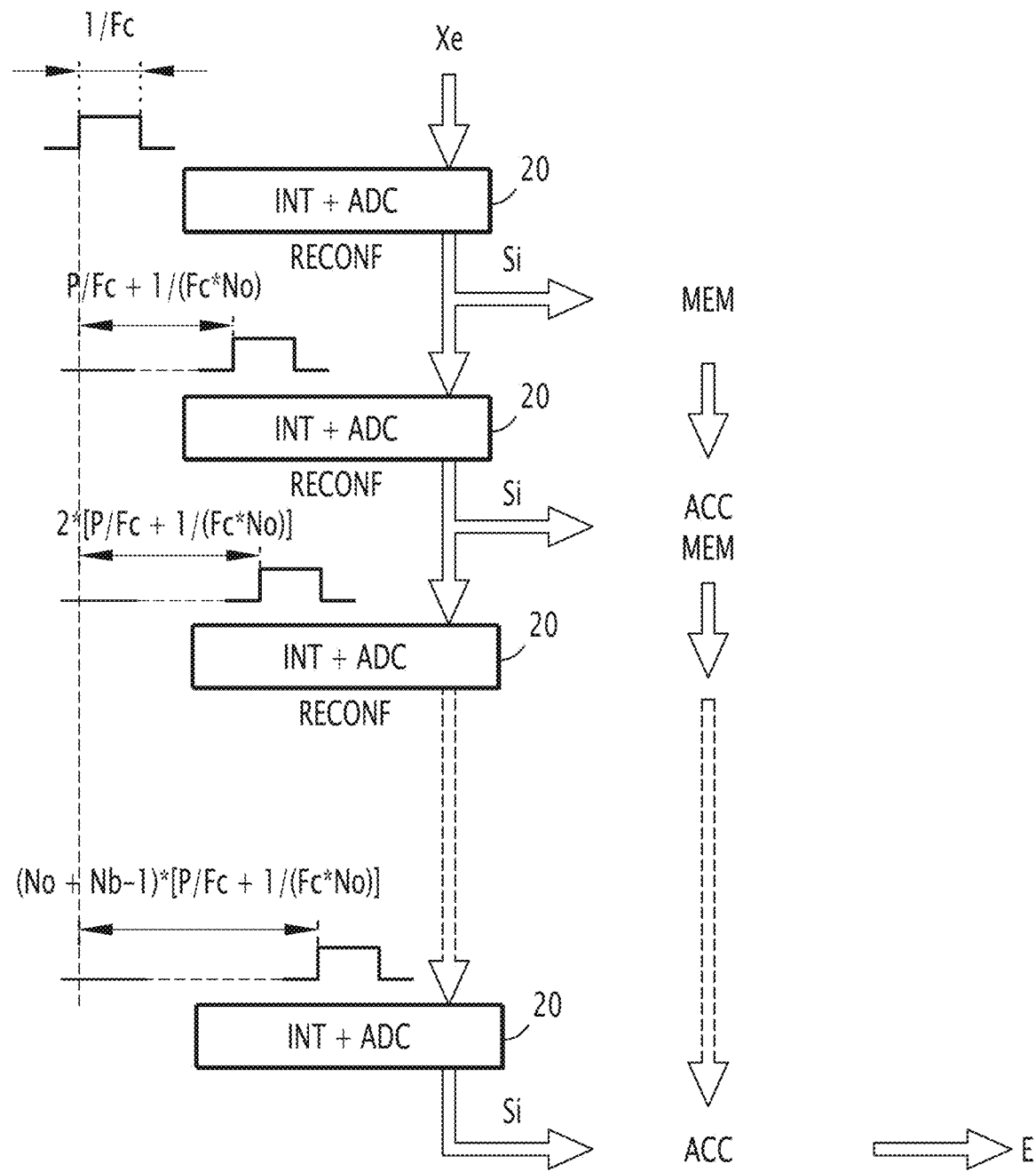
FIG. 4 is a flowchart of the implementation of the notch filter of FIG. 1, when the integration module comprises a single integration unit for integrating the input signal during the successive time windows.

In a variant, when the integration module 12 comprises a single integration unit 20, the integration module 12 is then configured to control the respective initial time instants for the successive time windows W1, W2, with a sufficient time offset from one initial time instant to the next to enable integration of the input signal Xe during each respective time window W1, W2 with said single integration unit 20, and to also enable its reconfiguration prior to proceeding to the next time window, as illustrated in the flowchart in FIG. 4.

In the example of FIG. 4, the No+Nb integrations related to the No+Nb successive time windows W1, W2 are performed with the same integration unit 20 and in a serialized manner, the offset between two successive initial time instants being equal to P/Fc+1/(Fc*No), with P/Fc representing a number P of periods equal to the inverse of the cut-off frequency Fc and 1/(Fc*No) representing a slip size, where the slips between successive time windows are evenly distributed, such as between the No first time windows W1, and thus correspond to phase shifts separated by 360°/No.

After each integration of the input signal Xe during a respective time window W1, W2, the integration module 12 is then able to reconfigure the integration unit 12, noted RECONF, before the next integration with the next time window, and the summing module 16 is configured to accumulate, noted ACC, the intermediate signal Si obtained for the integration of the input signal Xe during the current time window with the previous intermediate signals Si already obtained and having been memorized, noted MEM.

In other words, at the end of each windowed integration performed by the integration unit 20, the summing module 16 performs the accumulation ACC of the intermediate signal Si thus obtained with the intermediate signals Si previously obtained, and thus the memorization MEM, so that the result of the current accumulation ACC can thus be accumulated with the intermediate signal Si that will be obtained at the end of the next windowed integration, and so on.

At the end of the last windowed integration performed by the integration unit 20, the summing module 16 performs a last accumulation ACC of the last intermediate signal Si obtained and of the previously performed memorization MEM, corresponding to the sum of the No+Nb−1 intermediate signals Si previously obtained, to deliver the filtered signal E at the output of the notch filter 10.

Figure 5:
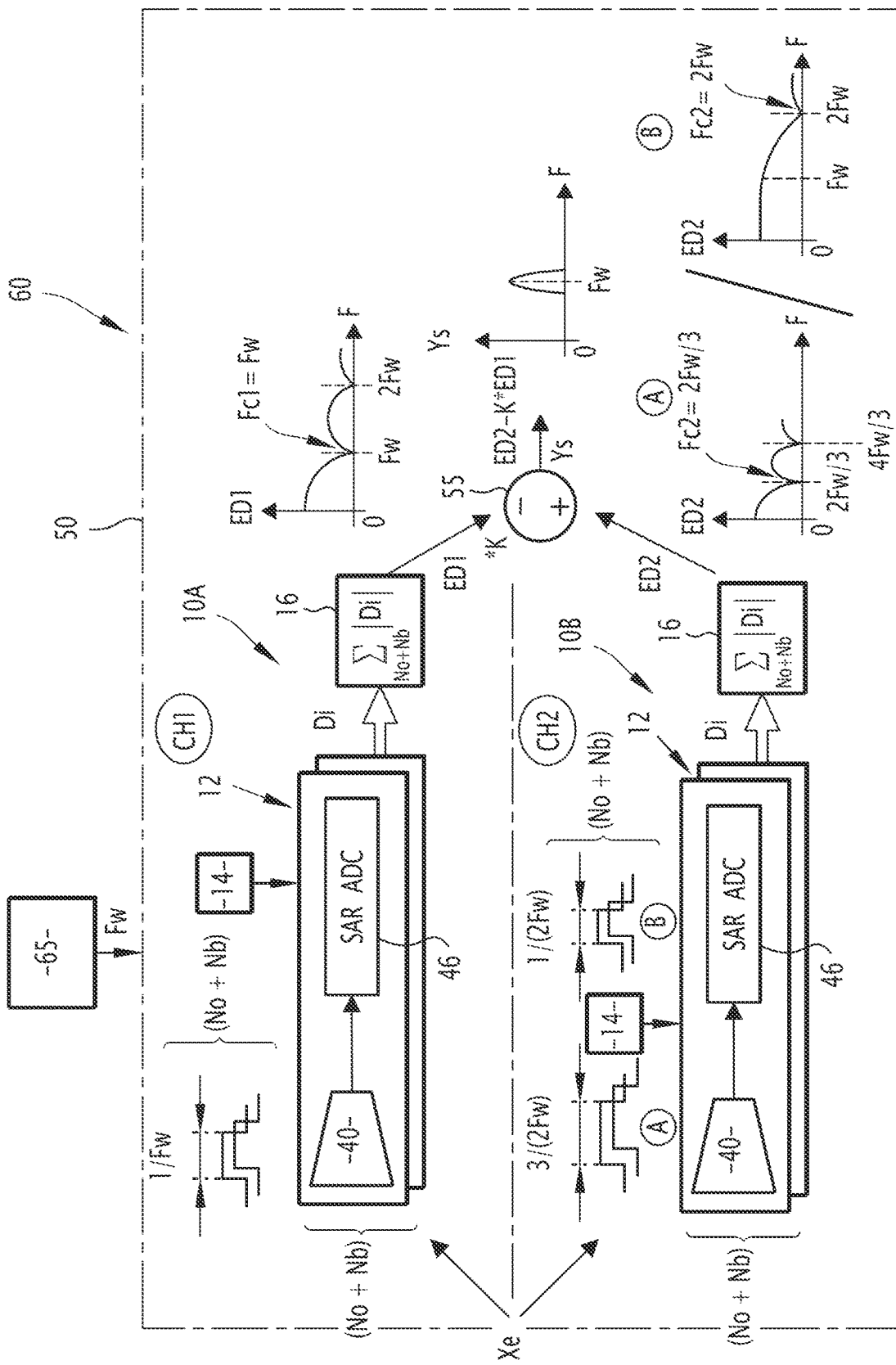
FIG. 5 is a schematic representation of an electronic band-pass filtering device according to the invention, comprising at least one electronic notch filter of the type shown in FIG. 1, according to a first embodiment.

In FIG. 5, an electronic band-pass filtering device 50 is configured to receive the input signal Xe and deliver an output signal Ys having an amplitude outside a frequency band centered around a target frequency Fw, also called working frequency, that is attenuated with respect to that of the input signal Xe. In other words, the band-pass filtering device 50 is able to substantially retain only said frequency band of the input signal Xe to deliver the output signal Ys.

According to the invention, the band-pass filter device 50 comprises at least one notch filter 10, as defined above.

In the example of FIG. 5, the band-pass filtering device 50 comprises a first notch filter 10A, able to receive the input signal Xe and deliver a first filtered signal E1 having an amplitude, at a first cutoff frequency Fc1, that is attenuated with respect to that of the input signal Xe, the first cutoff frequency Fc1 being substantially equal to the target frequency Fw.

According to this example of FIG. 5, the band-pass filtering device 50 comprises a second notch filter 10B, able to receive the input signal Xe and deliver a second filtered signal E2 having an amplitude, at a second cutoff frequency Fc2, attenuated with respect to that of the input signal Xe, the second cutoff frequency Fc2 being distinct from the first cutoff frequency Fc1, the second cutoff frequency Fc2 being strictly lower than the target frequency Fw or strictly higher than said target frequency Fw.

In the remainder of the description, by convention, the first filtered signal E1 is also noted ED1 when said first filtered signal is digital, or EA1 when said first filtered signal is analog. Similarly, the second filtered signal E2 is also denoted ED2 when said second filtered signal is digital, or EA2 when said second filtered signal is analog.

According to the invention, at least one and preferably each of the first 10A and second 10B notch filters is a notch filter 10, as defined above.

In the example shown in FIG. 2, the first 10A and second 10B notch filters are each a notch filter 10 as defined above, and are hence not described again in detail.

The band-pass filter device 50 also comprises a generation module 55 connected to the output of the first 10A and second 10B notch filters and configured to generate the output signal Ys from a combination of the first E1 and second E2 filtered signals.

The person skilled in the art will thus observe that each notch filter 10A, 10B typically comprises the integration module 12, the generation module 14 and the summing module 16, and that the only difference between the first 10A and second 10B notch filters lies in the different value of the implemented cutoff frequency Fc, namely the first cutoff frequency Fc1 for the first notch filter 10A, and the second cutoff frequency Fc2 for the second notch filter 10B.

In the example of FIG. 5, each notch filter 10A, 10B has its own generation module 14, in order to separately generate the clock edges for the successive time windows related to the first cutoff frequency Fc1, from those for the successive time windows related to the second cutoff frequency Fc2. In a variant, the first 10A and second 10B notch filters have the same generation module 14 in common, the latter thus being configured to generate the clock edges for both the time windows related to the first cutoff frequency Fc1 and those related to the second cutoff frequency Fc2.

The person skilled in the art will understand that since the first cutoff frequency Fc1 is substantially equal to the target frequency Fw, the first notch filter 10A thus forms a notch filter, or a stop-band filter around the target frequency Fw. The second notch filter 10B forms a notch filter around the target frequency Fw when the second cutoff frequency Fc2 is strictly lower than the target frequency Fw, and preferably when the latter is substantially equal to $\tfrac{2}{3}$ of the target frequency Fw, or even to $\tfrac{2}{5}$ of said target frequency Fw. In a variant, the second notch filter 10B forms a low-pass filter around the target frequency Fw when the second cutoff frequency Fc2 is strictly greater than the target frequency Fw, and preferably substantially equal to twice the target frequency Fw.

The combination obtained via the generation module 55 of such a band-pass filter around the target frequency Fw and notch filter around this target frequency Fw, or, in a variant, the combination of a low-pass filter around the target frequency Fw and the notch filter around the target frequency Fw, thus makes it possible to obtain a resulting band-pass filter that provides higher selectivity and better rejection around the target frequency Fw.

Thus, the band-pass filtering device 50 according to the invention makes it possible to provide good selectivity and high rejection around the target frequency Fw, even if the notch filtering carried out at the first cutoff frequency Fc1 and/or that carried out at the second cutoff frequency Fc2 are not very selective per se around the respective cutoff frequency Fc1, Fc2.

The person skilled in the art will note that, in the examples of FIGS. 5 to 16, the notch filtering at the first cutoff frequency Fc1, also referred to as first notch filter, corresponds to a first channel CH1; and that the notch filtering at the second cutoff frequency Fc2, also referred to as second notch filter, corresponds to a second channel CH2. The second channel CH2 is further noted in a configuration A when the second notch filtering forms a band-pass filtering around the target frequency Fw, i.e., when the second cutoff frequency Fc2 is strictly lower than the target frequency Fw; and noted in a configuration B, when the second notch filtering forms a low-pass filtering around the target frequency Fw, i.e., when the second cutoff frequency Fc2 is strictly higher than the target frequency Fw.

In a variant, the electronic notch filtering device 50 comprises a single notch filter 10 as defined above, and thus further comprises a control module configured to control this single notch filter 10, with the cutoff frequency equal to the first cutoff frequency Fc1, to perform the notch filtering around the target frequency Fw for the first channel CH1, on the one hand, and, on the other hand, with the second cut-off frequency Fc2, to perform the band-pass filtering around the target frequency Fw according to the configuration A, or the low-pass filtering around the target frequency Fw according to the configuration B for the second channel CH2.

The control module is thus configured to control the notch filter 10, for example, with its cutoff frequency equal to one of the first cutoff frequency Fc1 and the second cutoff frequency Fc2, and to store the signal obtained from among the first filtered signal E1 and the second filtered signal E2. The control module is thus configured to control the notch filter 10 with its cutoff frequency equal to the other one of the first cutoff frequency Fc1 and the second cutoff frequency Fc2, to obtain the other one of the first filtered signal E1 and the second filtered signal E2.

According to this embodiment, the band-pass filtering device 50 also comprises the generation module 55, configured to generate the output signal Ys from a combination of the first E1 and second E2 filtered signals, the generation module 50 thus being connected to the output of the control module.

Figure 6:
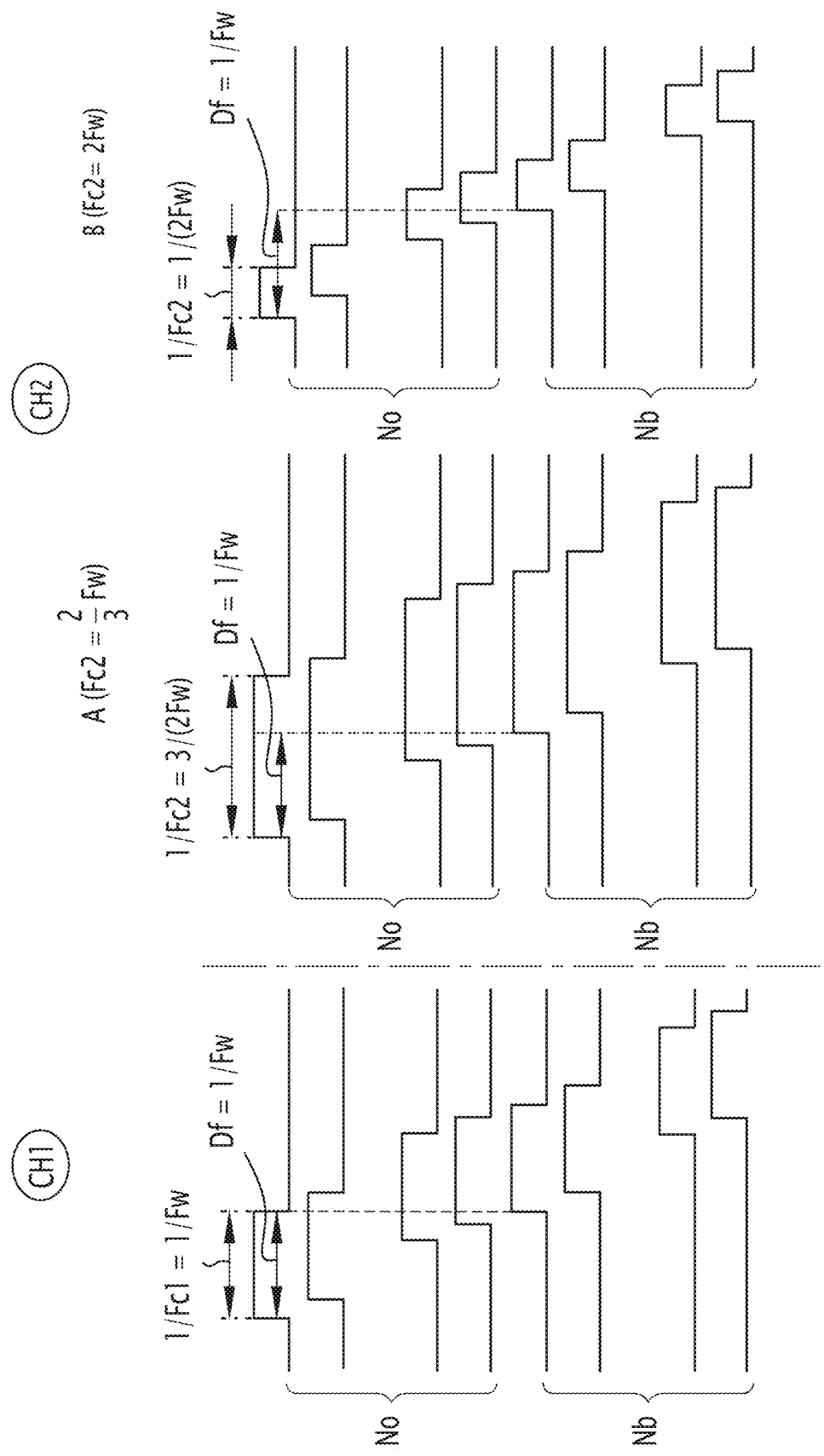
FIG. 6 is a schematic representation of successive first time windows for the embodiment of a notch filter with a first cutoff frequency, and successive second time windows for the embodiment of a respective notch filter with a second cutoff frequency.

The person skilled in the art will note that, regardless of the variant of the band-pass filtering device 50 according to the invention, when the first notch filtering and the second notch filtering are each performed using a notch filter 10 as defined above, the first and second notch filters are thus obtained via windowed integrations for several successive time windows for each of said filters, typically for No+Nb successive time windows for the first filtering on the first channel CH1 on the one hand, and for No+Nb successive time windows for the second filtering on the second channel CH2 on the other hand, as shown in FIG. 6.

The person skilled in the art will thus observe that the difference between the windowed integrations carried out for the first notch filtering of the first channel CH1 and those carried out for the second notch filtering of the second channel CH2 lies in the duration of the respective time windows. Indeed, for notch filtering via windowed integrations, the duration of each time window is substantially equal to the inverse of the targeted cutoff frequency Fc, and, given that the first cutoff frequency Fc1 is distinct from the second cutoff frequency Fc2, the time windows used for the first channel CH1, on the one hand, and for the second channel CH2, on the other hand, thus have distinct durations.

In addition, given that a notch filter is intended to generate attenuations of the filtered signal for multiples of its cutoff frequency, the second cutoff frequency Fc2 is preferably chosen so that the target frequency Fw lies approximately in the middle of two multiples of said second cutoff frequency Fc2.

According to this addition, the target frequency Fw satisfies the following equation for example:

$$Fw = \frac{L \cdot Fc2 + (L+1) \cdot Fc2}{2} \quad \text{[Math 3]}$$

where Fw represents the target frequency,
Fc2 represents the second cutoff frequency, and
L is a positive integer.

The second cutoff frequency Fc2 is thus preferably a rational multiple of the target frequency Fw. The second cutoff frequency Fc2 satisfies the following equation, for example:

$$Fc2 = \frac{2 \cdot Fw}{2 \cdot L + 1} \quad \text{[Math 4]}$$

where Fc2 represents the second cutoff frequency,
Fw represents the target frequency, and
L is a positive integer.

The equation (4) thus makes it possible to find the aforementioned example values for the second cutoff frequency Fc2. In particular, for L=0, the second cutoff frequency Fc2 is substantially equal to twice the target frequency Fw; for L=1, the second cutoff frequency Fc2 is substantially equal to ⅔ of the target frequency Fw; and, for L=2, the second cutoff frequency Fc2 is substantially equal to ⅖ of the target frequency Fw; and so on.

In the example of FIG. 6, the predefined reference duration Df is equal to the inverse of the target frequency Fw, and for each multiple successive time windows related to a respective notch filtering, the initial time instants of at least two distinct windows are thus separated by a time shift of a value greater than or equal to this predefined reference duration Df, and thus to the inverse of the target frequency Fw.

In this example of FIG. 6, the person skilled in the art will thus understand that the predefined reference duration Df is chosen as a function of the first cutoff frequency Fc1, and thus equal to the inverse of the first cutoff frequency Fc1, i.e. equal to the inverse of the target frequency Fw.

This predefined reference duration Df is thus preferably used both for the first notch filtering of the first channel CH1 and for the second notch filtering of the second channel CH2. This then typically allows for synchronization of the initial time instants of the successive time windows implemented for the second notch filtering of the second channel CH2 with those of the successive time windows implemented for the first notch filtering of the first channel CH1. Such synchronization thus allows for simpler phase information, as described later in view of FIG. 2, while also allowing for simpler implementation of the band-pass filtering device 50.

The generation module 55 is configured to generate the output signal Ys from a combination of the first E1 and second E2 filtered signals. The generation module 55 is thus configured to perform a linear combination of the first E1 and second E2 filtered signals, for example, to obtain the output signal Ys.

The linear combination of the first E1 and second E2 filtered signals satisfies the following equation, for example:

$$Ys = E2 - K \cdot E1 \quad \text{[Math 5]}$$

where Ys represents the output signal,
E1 represents the first filtered signal,
E2 represents the second filtered signal,
K is an integer greater than or equal to 1.

The multiple K is typically a power of 2, and is thus written:

$$K = 2^P \quad \text{[Math 6]}$$

with P a positive integer.

The electronic band-pass filtering device 50 according to the invention is further adapted to be implemented according to different embodiments.

In the example of FIG. 5, the embodiment of the band-pass filtering device 50 is essentially a digital implementation, with only the conversion stage 40 being analog, and the elements connected following this conversion stage 40 on each channel CH1, CH2 being digital elements, with the analog-to-digital converter with successive approximation register 46, the digital-type summing module 16 and the generation module 55, successively, also of a digital type.

FIGS. 7 to 12 illustrate the results of numerical simulations carried out with the embodiment of FIG. 5, and will be described in more detail below.

Figure 13:
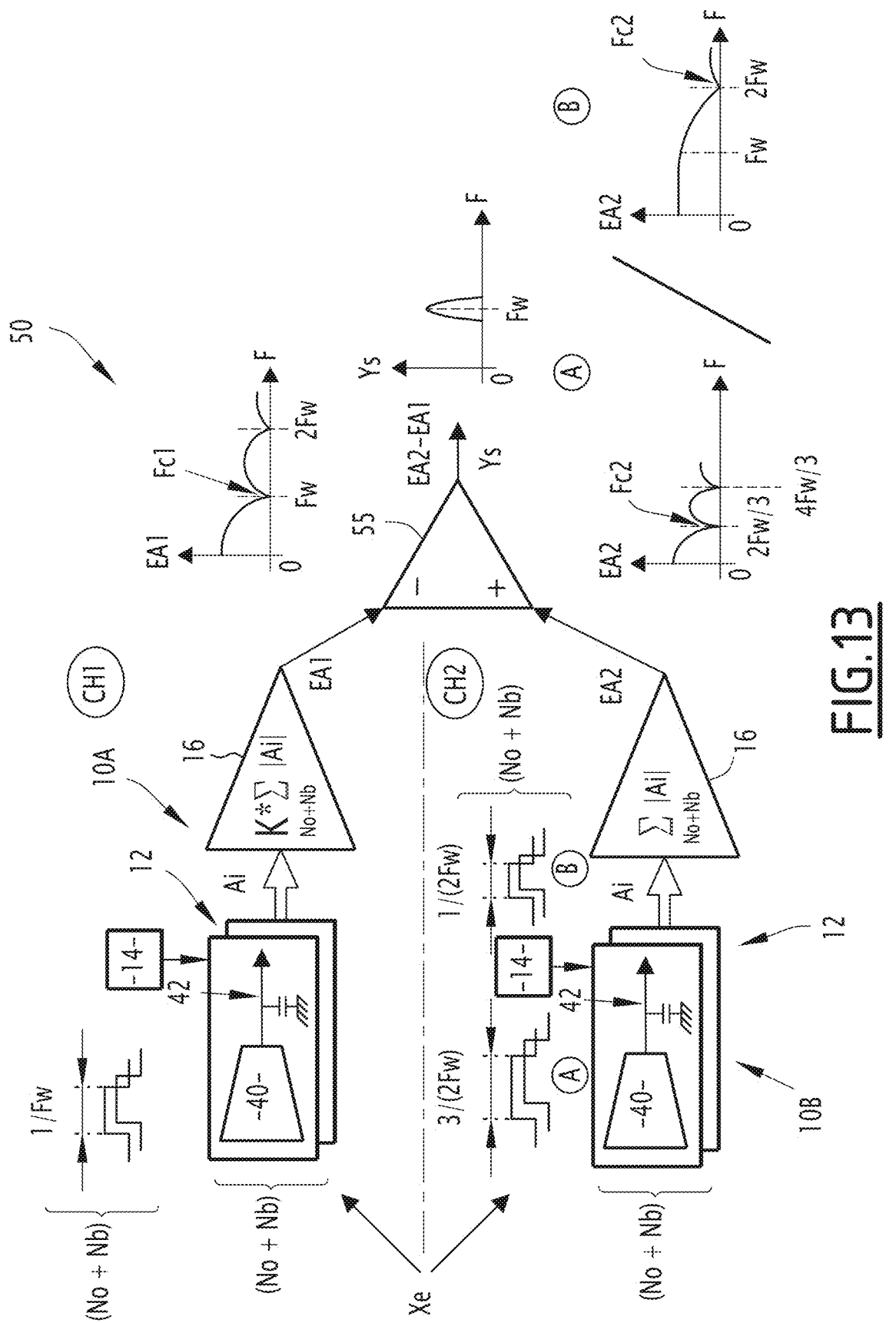
FIG. 13 is a view similar to that of FIG. 5, according to a second embodiment.

In the example of FIG. 13, the embodiment of the band-pass filtering device 50 is fully analog, the conversion stage 40 and the averaging stage 42 of each integration unit 20 being analog stages, connected to the input of the summing module 16, also analog, and the two analog summing modules 16 of the two channels CH1, CH2 are themselves connected to the input of an analog-type generation module 55, the latter being an operational amplifier, for example, arranged in a subtractor assembly.

Figure 14:
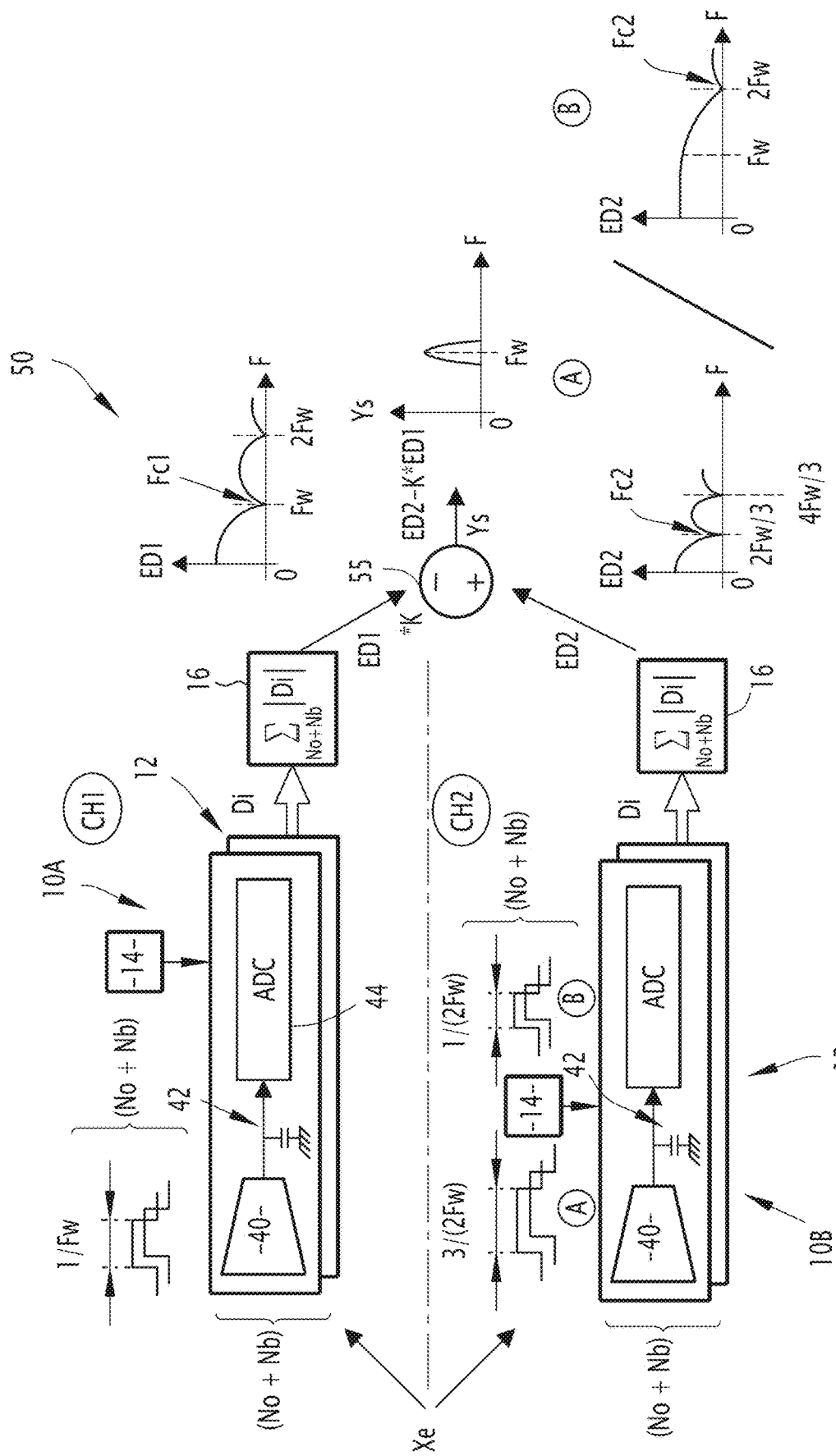
FIG. 14 is a view similar to FIG. 5, according to a third embodiment.

In the example of FIG. 14, the embodiment of the band-pass filtering device 50 is partially analog and partially digital, with the conversion stages 40 and the averaging 42 being analog and connected to the input of the analog-to-digital converter 44 within each integration unit 20, and each analog-to-digital converter 44 thus connected to the input of a respective digital-type summing module 16, with each summing module 16 itself being connected to the input of a digital-type generation module 55.

An important application of the band-pass filtering device 50 according to the invention is frequency detection, and a frequency detection system 60, in particular for a radio receiver, is thus shown in FIG. 5, with it being observed that this frequency detection system 60 is achievable whatever the embodiment of the band-pass filtering device 50, in particular from among the example embodiment of FIGS. 5, 13 and 14.

The frequency detection system 60 thus comprises the electronic band-pass filtering device 50, able to receive the input signal Xe and deliver the output signal Ys having an amplitude, outside the frequency band centered around the target frequency Fw, that is attenuated with respect to that of the input signal Xe.

The frequency detection system 60 also comprises an electronic control device 65 able to vary the value of the target frequency Fw of the band-pass filtering device 50 until a characteristic frequency of the input signal Xe is detected, the characteristic frequency thus corresponding to the current value of the target frequency Fw.

The electronic control device 65 is configured to vary the value of said target frequency Fw, for example, from a minimum value of the target frequency Fw_min to a maximum value of the target frequency Fw_max, typically with a variation of a predefined frequency step between two successive values of said target frequency Fw.

FIGS. 7 to 12 illustrate the results of simulations performed with the filtering device 50 according to the embodiment of FIG. 5, and these results are particularly conclusive, as will be explained now.

Figure 7:
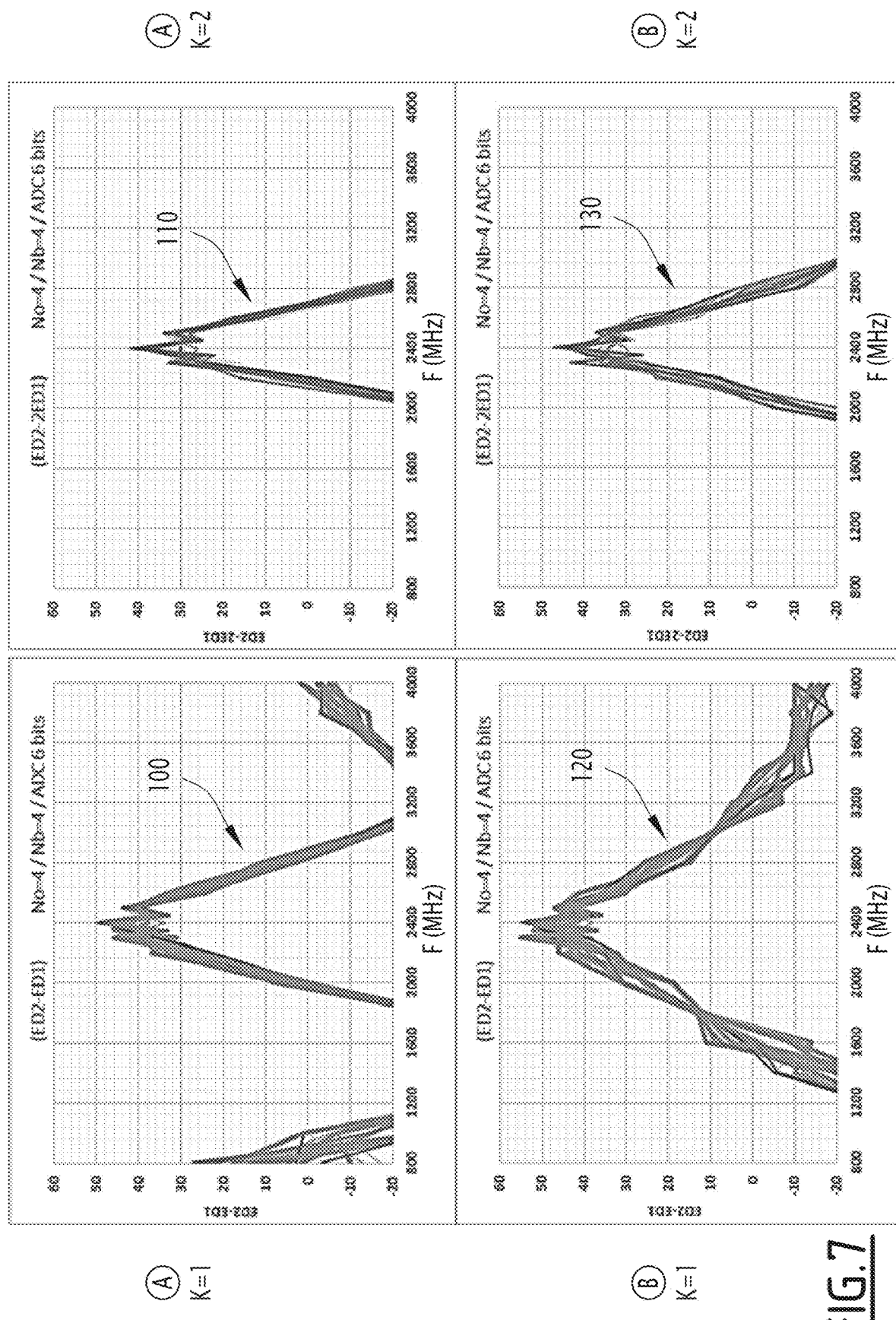
FIG. 7 is a set of curves illustrating simulated signals at the output of the band-pass filtering device of FIG. 5 for two distinct values of the second cutoff frequency, and for two distinct combinations of first and second filtered signals, these filtered signals resulting from application of the band-pass filter at the first cutoff frequency and at the second cutoff frequency, respectively

In FIG. 7, the curves 100 show the output signal Ys obtained with the configuration A of the second channel CH2, with the multiple K equal to 1, the curves 110 still representing the same output signal Ys for the configuration A of the second channel CH2, this time with the multiple K equal to 2. The curves 120 are curves similar to the curves 100, obtained for configuration B of the second channel CH2 and for the multiple K equal to 1, and the curves 130 show the output signal Ys obtained with the configuration B of the second channel CH2 with the multiple K equal to 2. It is thus observed that the band-pass filtering device 50 provides better selectivity for the multiple K equal to 2 than when it is equal to 1. The results obtained overall are equivalent with configuration A or configuration B of the second channel CH2, the selectivity of the band-pass filtering device 50 being a little better with configuration A, however, than with configuration B of the second channel CH2.

Figure 8:
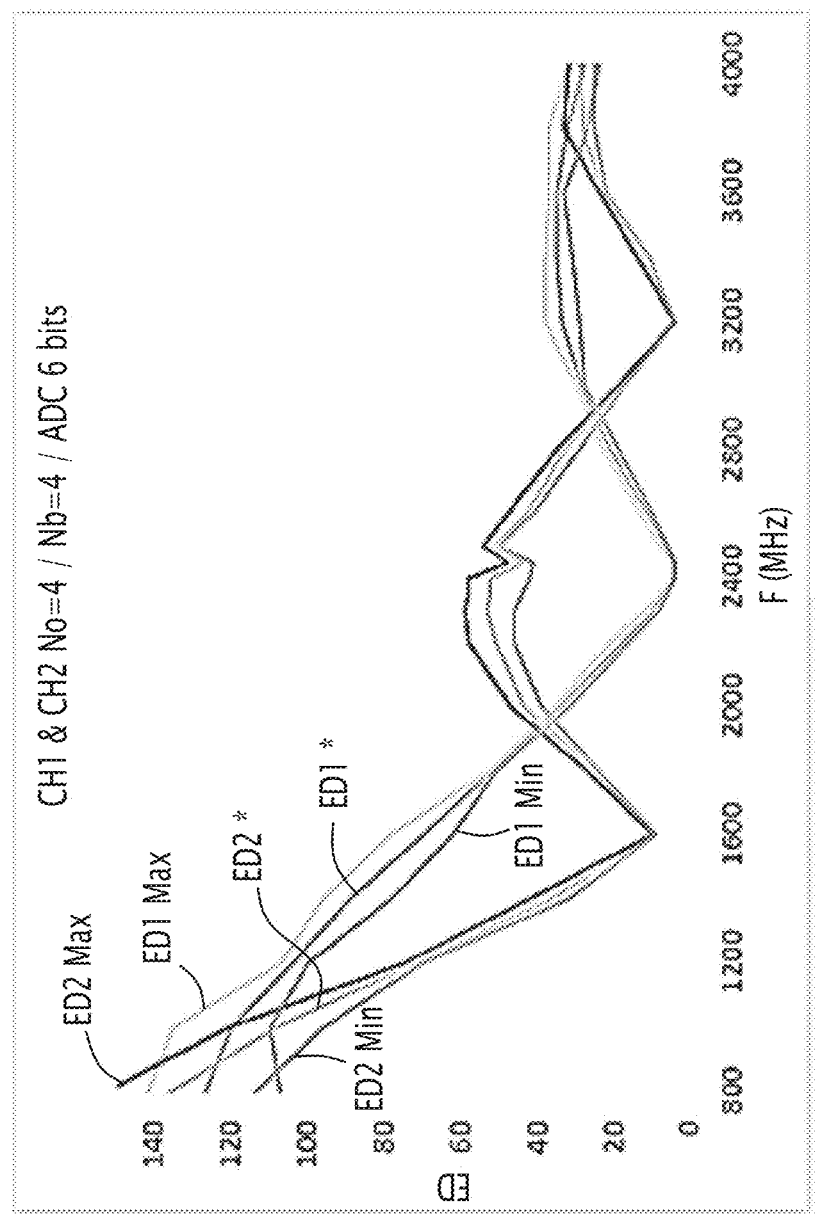
FIG. 8 is a set of curves representing a transfer function of the notch filter with the first cutoff frequency on the one hand, and, on the other hand, a transfer function of the notch filter with the second cutoff frequency for a value of the second cutoff frequency lower than a target frequency of the notch filtering device, such as ⅔ of the target frequency.
Figure 8:
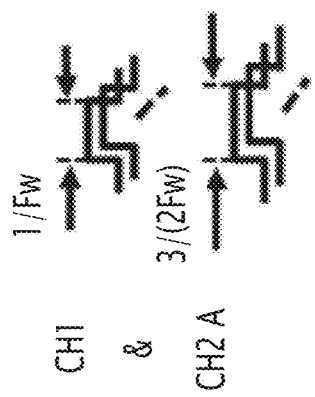

FIG. 8 thus represents the transfer functions at the output of the first and second channels CH1, CH2 and before the combination performed by the generation module 55, for the configuration A of the second channel CH2. We can thus see from these results that the average transfer functions, noted ED1*, ED2* respectively, are indeed representative of the filtering carried out, and that the transfer function variation is relatively small between the extreme transfer functions, namely ED1min and ED1max on the one hand, and ED2min and ED2max, on the other.

The curves of FIG. 8 show, moreover, that the first cut-off frequency Fc1, corresponding also to the target frequency Fw, is substantially equal to 2400 MHz, and that the second cut-off frequency Fc2 is substantially equal to 1600 MHz, the second cut-off frequency Fc2 thus being substantially equal to ⅔ of the target frequency Fw, concerning configuration A.

Figure 9:
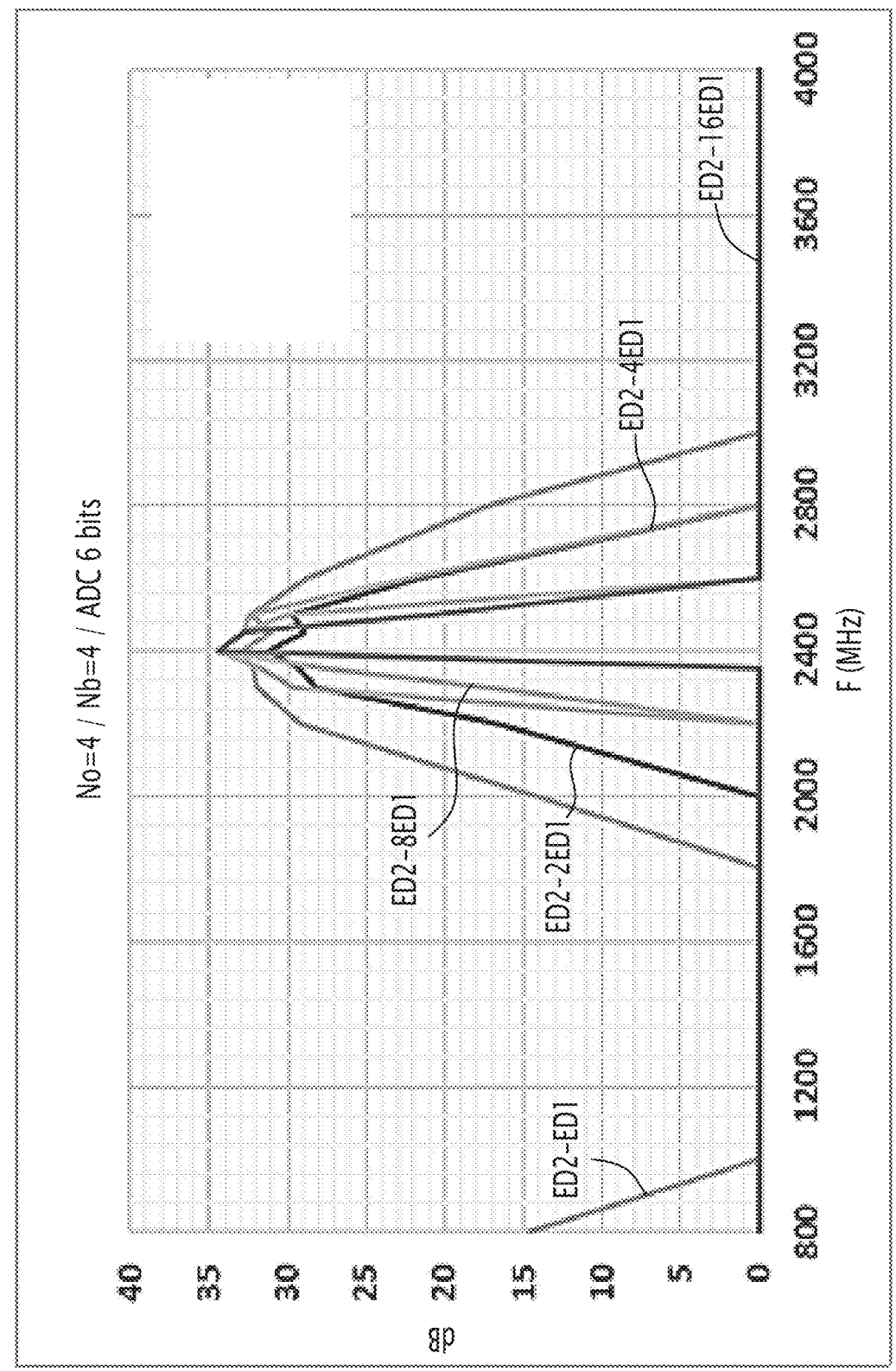
FIG. 9 is a set of curves representing a transfer function of the band-pass filter device of FIG. 5 with the value of the second cutoff frequency lower than the target frequency and for different combinations of the first and second filtered signals.

FIG. 9 represents the transfer functions obtained at the output of the band-pass filtering device 50 for the configuration A of the second channel CH2, and for different values of the multiple K. These curves confirm that the target frequency Fw is substantially equal to 2400 MHz, and show especially that the higher the value of the multiple K, the better the selectivity of the band-pass filtering device 50.

Figure 10:
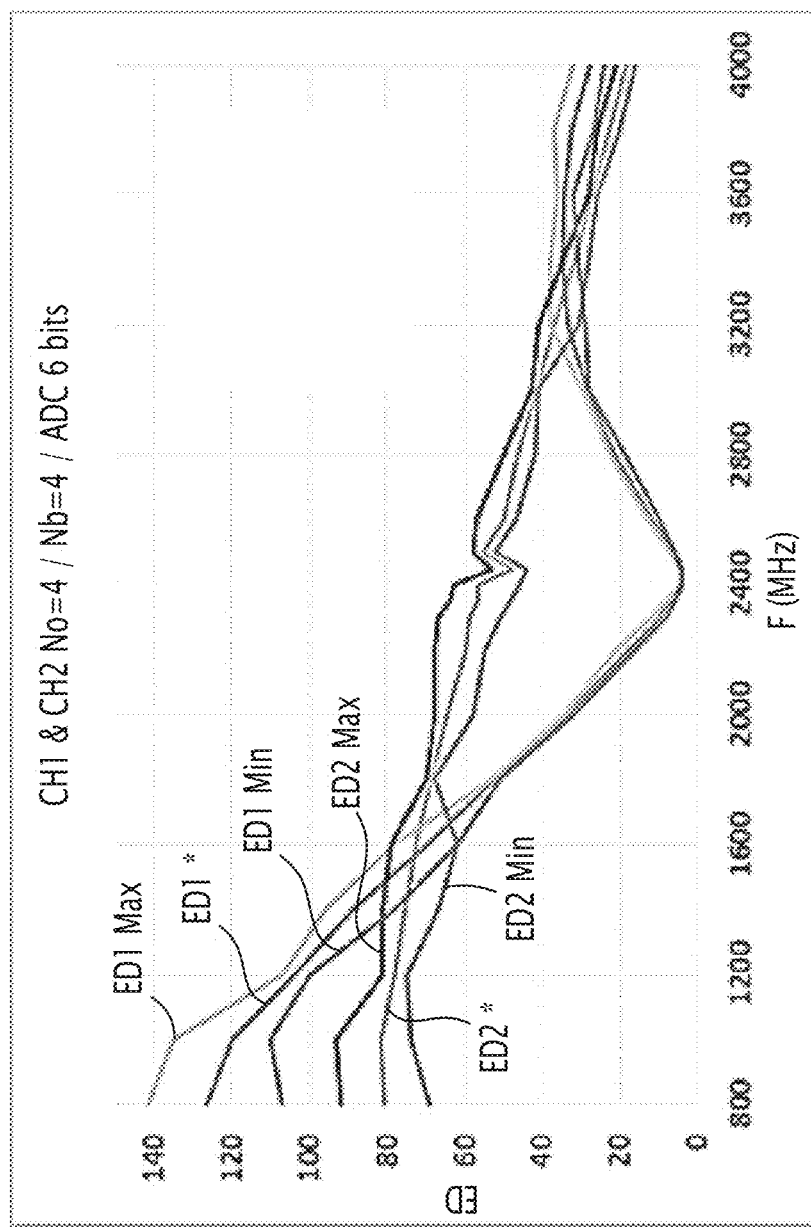
FIG. 10 is a view similar to FIG. 8 for a value of the second cutoff frequency higher than the target frequency, such as twice the target frequency.
Figure 10:
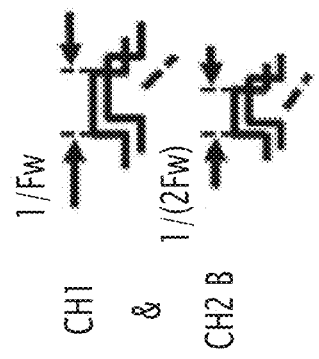
Figure 11:
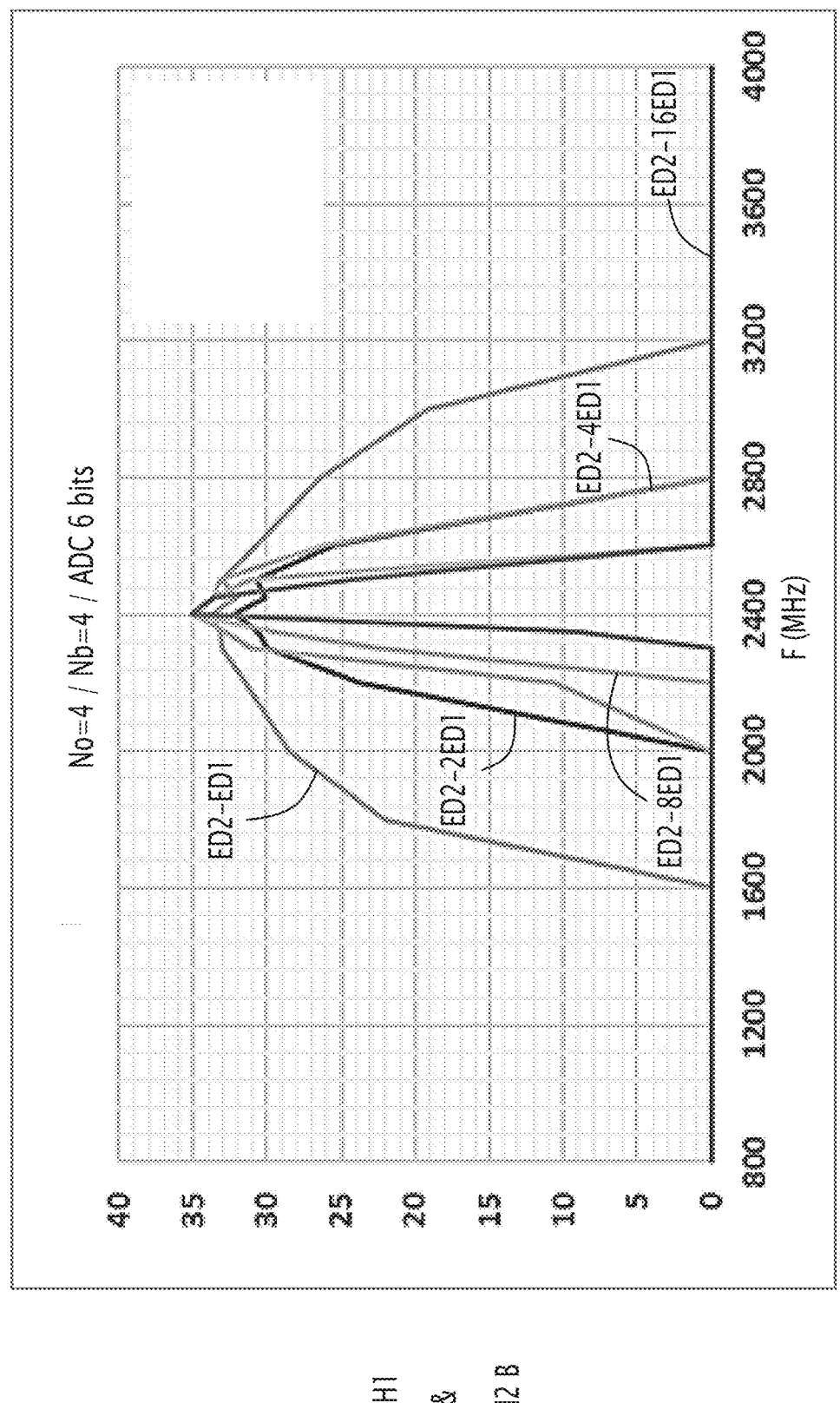
FIG. 11 is a view similar to FIG. 9 for the value of the second cutoff frequency higher than the target frequency.

FIG. 10 is a view analogous to that of FIG. 8 for the configuration B of the channel CH2, and FIG. 11 is a view analogous to that of FIG. 9 for this configuration B of the second channel CH2. The curves of the transfer function at the output of the first channel CH1 visible on FIG. 10 are thus identical to those visible on FIG. 8 for the same first channel CH1. The transfer function curves obtained at the output of the second channel CH2 with the configuration B, i.e. with low-pass filtering around the target frequency Fw, which is substantially equal to 2400 MHz, and with a second cut-off frequency Fc2, which is substantially equal to 2Fw, i.e. close to 4800 MHz, also show little variability, with the variations between the extreme curves ED2min and ED2max of the transfer function, on either side of the mean curve ED2* of the transfer function, being fairly limited.

In a similar manner to FIG. 9, the curves visible in FIG. 11 of the transfer function at the output of the band-pass filtering device 50 with the second channel CH2 in the configuration B, show that the target frequency Fw is also substantially equal to 2400 MHz, with also a better selectivity for the higher values of the multiple K.

Figure 12:
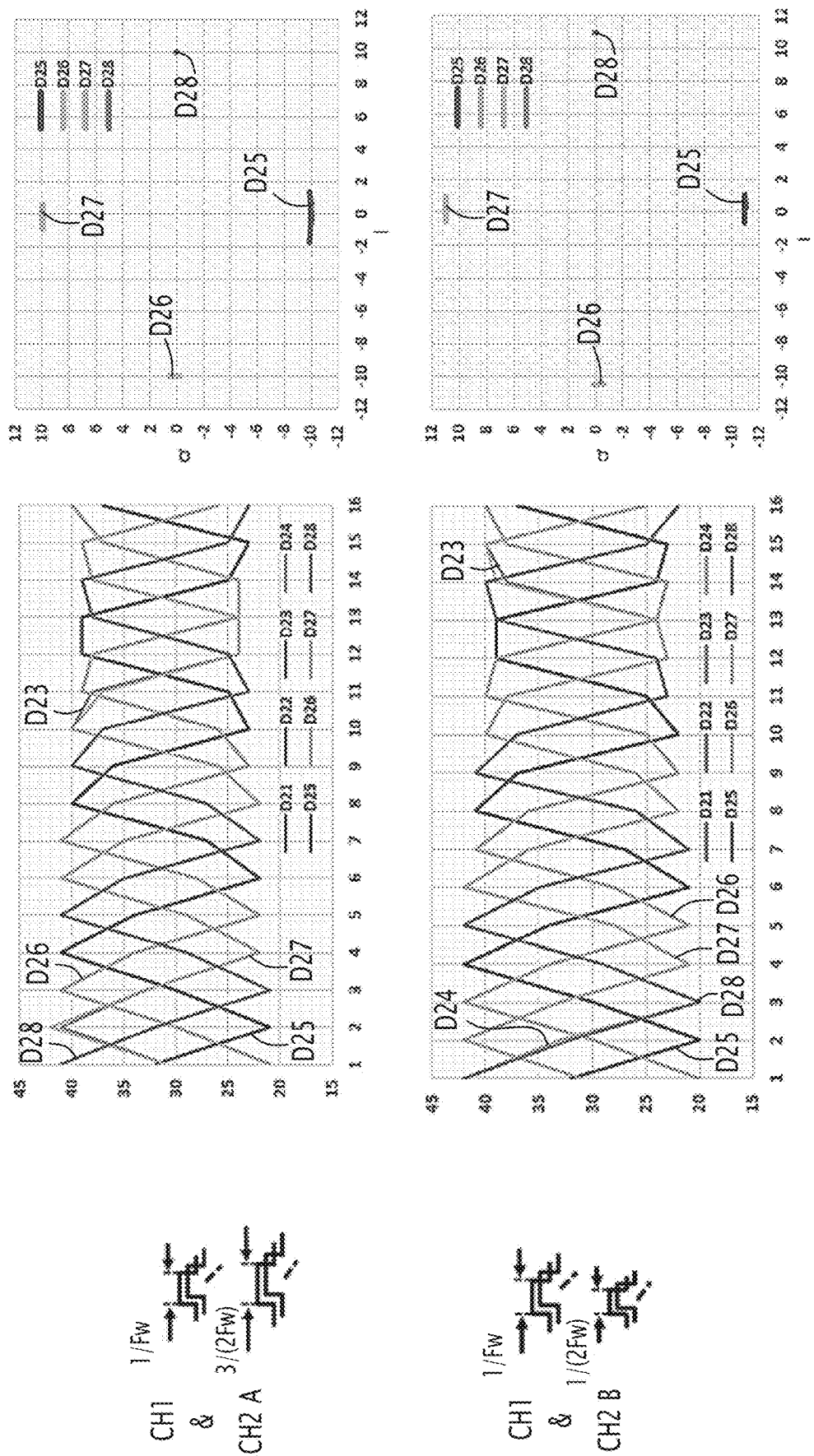
FIG. 12 is a set of curves representing the signal obtained following integration of the input signal for different successive time windows via the notch filter with the second cutoff frequency, for the value of the second cutoff frequency lower than the target frequency on the one hand, and for the value of the second cutoff frequency higher than the target frequency, on the other hand; as well as constellation diagrams corresponding to these curves.

Finally, the phase curves and constellation diagrams shown in FIG. 12 show that the band-pass filtering device 50 according to the invention also makes it possible to obtain phase information using conversion data from the second channel CH2, regardless of the configuration from among the configurations A or B of said channel CH2.

In particular, these curves in FIG. 12 show the recovery of 2 times 4 phases of the detected signal with the curves D21 to D28 corresponding to the No+Nb sliding clocks, with No=Nb=4, i.e. offsets respectively equal to 0°, 90°, 180°, 270°, 360°, 450°, 540° and 630°. These curves and constellation diagrams thus show that the phases at the target frequency Fw are recoverable at the end of the filtering process with significant precision, allowing PSK (Phase-Shift Keying) type coding modulations to be envisaged.

Figure 15:
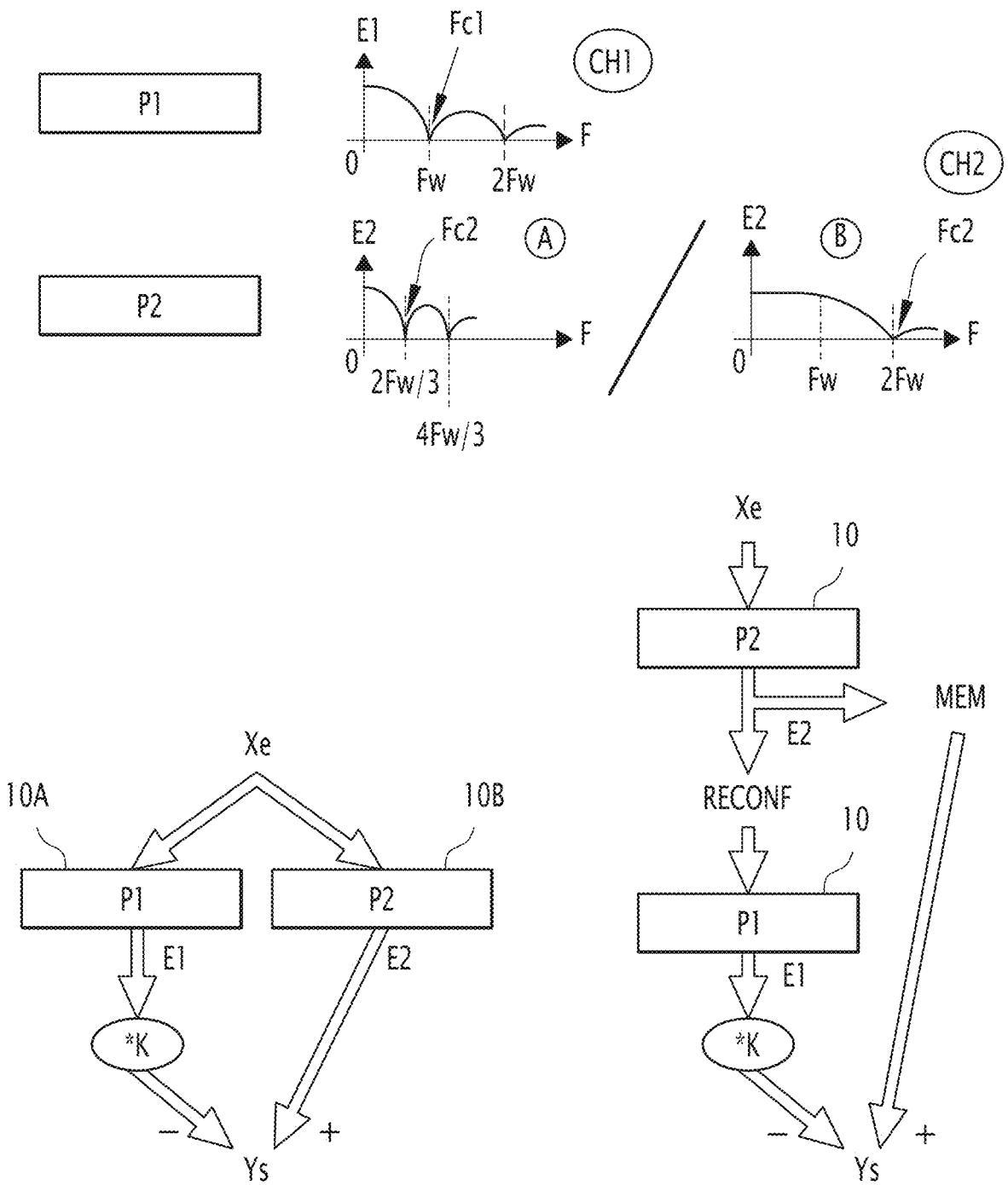
FIG. 15 represents a first flowchart of the embodiment of the electronic band-pass filtering device according to the invention when it comprises first and second distinct notch filters, arranged in parallel; and a second flowchart of the embodiment of the band-pass filtering device according to the invention when it comprises a single notch filter, successively implemented for the first cutoff frequency and for the second cutoff frequency, respectively.
Figure 16:
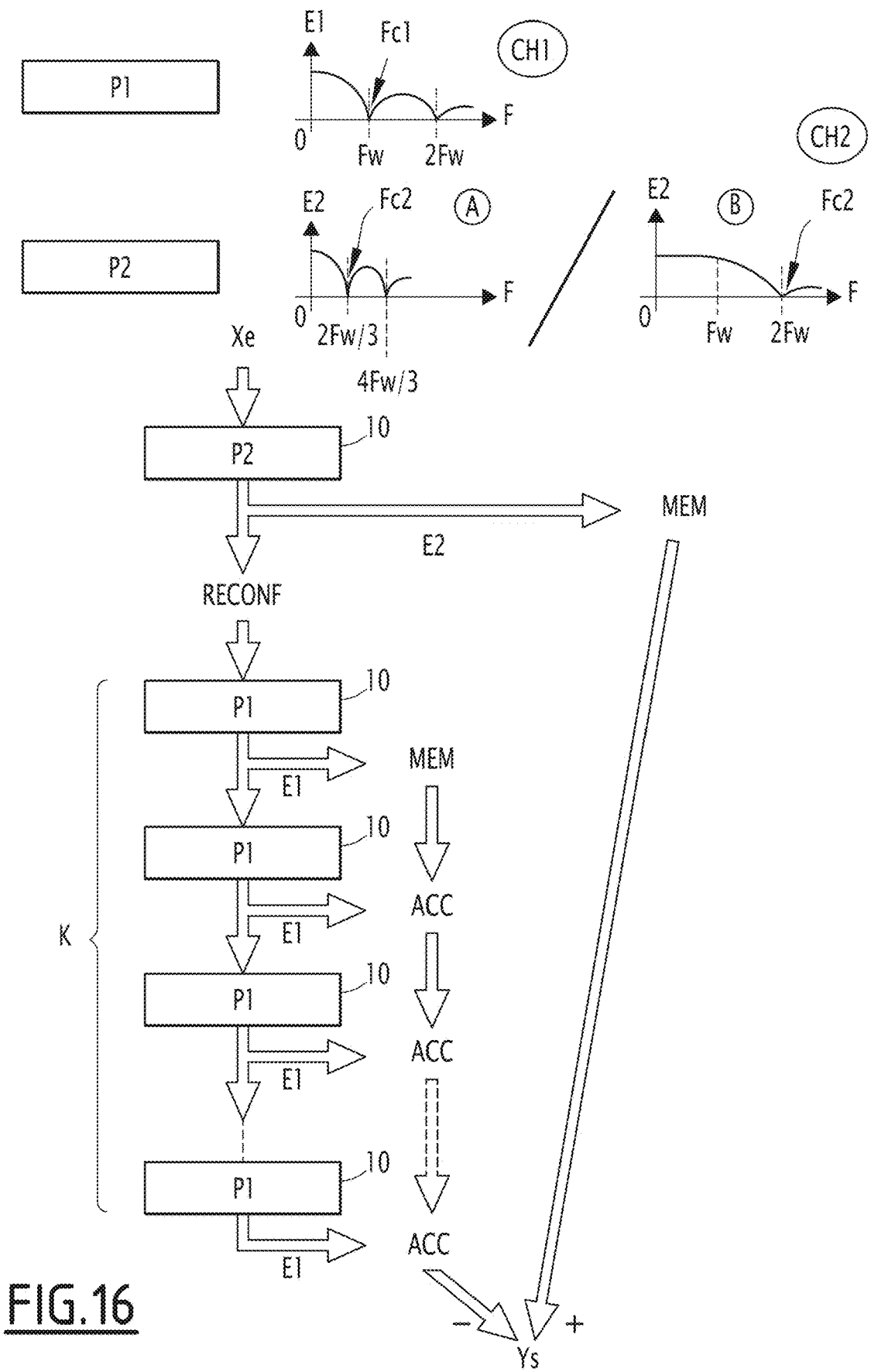
FIG. 16 represents a third flow chart for the embodiment of the electronic band-pass filtering device according to the invention when it comprises the single notch filter.

FIGS. 15 and 16 thus illustrate different variant embodiments of the electronic band-pass filtering device 50 according to the invention, in particular depending on whether the electronic band-pass filtering device 50 comprises first 10A and second 10B notch filters that are distinct and connected in parallel with each other, or a single notch filter 10 controlled successively by the control module to perform the first and second successive notch filters.

In FIGS. 15 and 16, the embodiment of the first notch filtering for the first channel CH1 and at the first cutoff frequency Fc1 corresponds to a first process P1. The embodiment of the second notch filtering for the second channel CH2 and at the second cutoff frequency Fc2 corresponds to a second process P2, both for the second cutoff frequency Fc2, substantially equal to ⅔ of the target frequency Fw and corresponding to configuration A, and for the second cutoff frequency Fc2, substantially equal to two times the target frequency Fw and corresponding to the configuration B.

A first variant embodiment of the band-pass filtering device 50, shown on the left of FIG. 15, thus corresponds to a parallel implementation of the first P1 and second P2 processes from the input signal Xe, this via the first notch filter 10A for the first process P1 on the one hand, and via the second notch filter 10B for the second process P2 on the other. The result from the first process P1 is thus multiplied by the multiple K before being subtracted from that from the second process P2 to obtain the output signal Ys.

A second variant embodiment of the band-pass filtering device 50, shown on the right of FIG. 15, corresponds to a successive implementation of the first P1 and second P2 processes, typically via a single notch filter 10. According to this second variant embodiment, the input signal Xe is first processed according to the second process P2 at the end of which the second filtered signal E2 obtained is memorized via the memorization operation MEM. The notch filter 10 is thus reconfigured via the reconfiguration operation RECONF in order to be able to carry out the first process P1 on the input signal Xe, the first filtered signal E1 obtained at the end of this first process P1 then being multiplied by the multiple K before being subtracted from the second filtered signal E2, previously memorized, to obtain the output signal Ys.

A third variant embodiment of the band-pass filtering device 50 according to the invention is shown in FIG. 16 and corresponds to a serialization of the first and second processes P1, P2. in the same way as the second variant.

According to this third variant embodiment, the input signal Xe is first processed by the second process P2 in order to obtain the second filtered signal E2, which is memorized via the memorization operation MEM. At the end of the second process P2, the notch filter 10 used to perform this second process P2 is reconfigured via the reconfiguration operation RECONF in order to be able the perform the first process P1. Unlike the second variant, where the process P1 is performed only once before the first filtered signal E1 is transmitted to a multiplier for multiplication by the multiple K, the third variant embodiment comprises K times the implementation of this first process P1 with a memorization operation MEM at the end of the first execution of the first process P1, and then successive accumulation operations ACC at the end of each new iteration of the first process P1, in order to obtain K times the first filtered signal E1 without using a multiplier and then using successive accumulation operations ACC until obtaining K times the first filtered signal E1. This signal corresponding to K times the first filtered signal E1 is then subtracted from the second filtered signal E2 that was initially memorized, in order to deliver the output signal Ys.

Table 1 below thus shows comparisons between these three variants embodiments, observing that the duration of each process P1, P2 corresponds substantially to the sum of an integration duration of the order of 4 times the inverse of the target frequency Fw, i.e. approximately 2 ns, and an analog-to-digital conversion duration of the order of 3 ns, each process P1, P2 thus having a duration of approximately 5 ns.

TABLE 1

|  | 1st variant | 2nd variant | 3rd variant |
|---|---|---|---|
| Process duration | ~5 ns | ~10 ns | ~(K + 1) × 5 ns |
| Consumption | ×1 | ×1 | ×(K + 1)/2 |
| Area occupied | ×2 | ×1 | ×1 |
| Gain signal-to-noise ratio | 0 | 0 | ~√K |

This table 1 thus shows that the first variant embodiment is the one allowing a maximum throughput to be provided, the second variant is the one allowing an optimized throughput to be provided with respect to the power consumption and the surface occupied by a circuit implementing this variant; and the third variant is the one allowing the signal to noise ratio to be improved.

Figure 17:
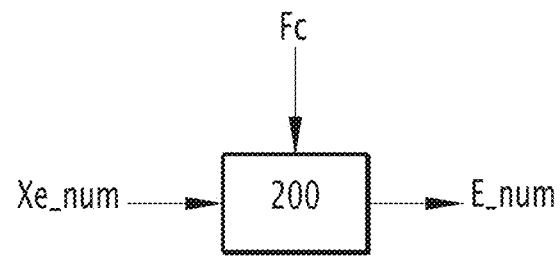
FIG. 17 represents a flow chart of a method according to the invention for processing a digital signal.
Figure 17:
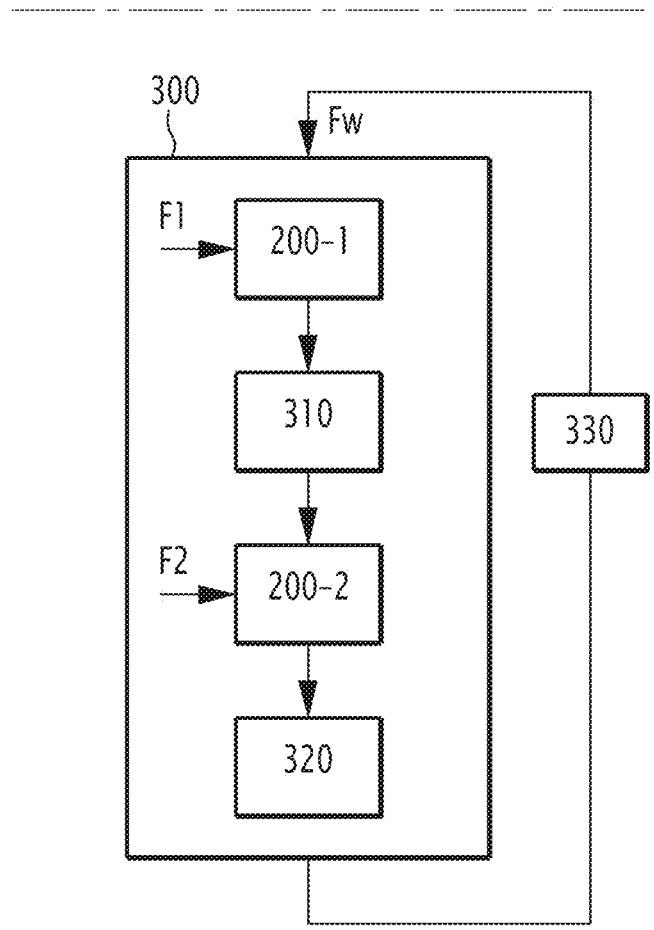

The invention also relates to a method for processing a digital input signal Xe_num, as shown in the flowchart of FIG. 17, the digital input signal Xe_num being able to be supplied by an analog-to-digital converter connected to the output of a sensor, not shown, suitable for receiving the analog input signal Xe.

The processing method is implemented by computer and comprises a step 200 of notch filtering the input digital signal Xe_num into a filtered digital signal E_num, the filtered digital signal E_num having an amplitude at the cutoff frequency Fc attenuated with respect to that of the input signal Xe_num.

According to the invention, the filtering step 200 thus comprises an integration of the input signal Xe_num during several successive time windows W1, W2 each time window W1, W2 starting at a respective initial time instant and having a duration substantially equal to the inverse of the cutoff frequency Fc.

As described above, the initial time instants of at least two distinct windows are separated by a time offset of value greater than or equal to the predefined reference duration Df, such as the inverse of the cutoff frequency Fc, and each integration of the input digital signal Xe_num during a respective time window results in a respective intermediate digital signal Si_num.

The filtering step 200 then comprises a summing of the intermediate digital signals Si_num to subsequently obtain the filtered digital signal E_num, the filtered digital signal E_num depending on the sum of the intermediate digital signals Si_num.

In addition, the processing method according to the invention comprises a band-pass filtering process 300 for filtering the input digital signal Xe_num into the output digital signal Ys_num, the output digital signal Ys_num, outside the band of frequencies centered around the target frequency Fw, having an attenuated amplitude as compared to that of the input digital signal Xe_num.

The filtering process 300 then comprises an initial implementation, noted 200-1, of the notch filtering step 200, with the cutoff frequency Fc equal to a first frequency F1 among the first cutoff frequency Fc1 and the second cutoff frequency Fc2, the first cutoff frequency Fc1 being substantially equal to the target frequency Fw, and the second cutoff frequency Fc2 being distinct from the first cutoff frequency Fc1, the second cutoff frequency Fc2 being either strictly lower than the target frequency Fw, or strictly higher than said target frequency Fw.

The band-pass filtering process 300 then comprises a step 310 of storing the signal obtained among a first filtered digital signal E1_num related to the first cutoff frequency Fc1 and a second filtered digital signal E2_num related to the second cutoff frequency Fc2.

The band-pass filtering process 300 then comprises subsequent implementation, noted 200-2, of the notch filtering step 200 with the cutoff frequency Fc equal to a second frequency F2 among the first cutoff frequency Fc1 and the second cutoff frequency Fc2, i.e. equal to the other one among the first cutoff frequency Fc1 and the second cutoff frequency Fc2, in order to obtain the other signal among the first filtered digital signal E1_num and the second filtered digital signal E2_num.

The band-pass filtering process 300 finally comprises a step 320 of generating the output digital signal Ys_num from the combination of the first E1_num and second E2_num filtered digital signals. In this generation step 320, the combination of the first E1_num and second E2_num filtered digital signals is typically a linear combination. This linear combination satisfies the preceding equations (5) and (6), for example.

As an optional addition, the processing method according to the invention comprises several iterations of the band-pass filtering process 300 for different successive values of the target frequency Fw, until a characteristic frequency of the input digital signal Xe_num is detected, the characteristic frequency thus corresponding to the current value of the target frequency Fw.

According to this optional addition, the method then comprises a step 330 at the end of each band-pass filtering process 300 of modifying the target frequency value Fw. During this modification step 330, the value of the target frequency Fw is initially equal to the minimum value of the target frequency Fw_min, for example, and is then incremented by the predefined frequency step at each new iteration until the maximum value of the target frequency Fw_max is reached.

Thus, the electronic notch filter 10 according to the invention and the related electronic band-pass filtering device 50 make it possible to perform the desired filtering in a reduced time, with the implementation duration of each notch filtering by integration of the input signal Xe during several successive time windows W1, W2 reduced to a few target signal periods, typically of the order of 5 ns.

This optimized notch filtering duration according to the invention thus makes it possible to access the useful information more quickly, to reduce the power consumption induced by such filtering, in particular if said filtering is integrated into a duty-cycling type architecture, with the power consumption of the notch filter 10 thus being about 1.5 mA for about 5 ns, representing an efficiency of 7.5 pJ/bit with an OOK rate of 200 kbps. This optimized duration also allows for improvement in the data rate processed by such filters and/or an increase in a number of objects interconnected to such filters.

The gain of the notch filter 10 according to the invention is further adjustable by changing one of the windowed integration parameters, namely by changing the integration transconductance $g_m$ and/or the integration capacitance $C_{int}$. This gain adjustment option is very useful in a radio receiver where it may be necessary to adjust the gain in order to avoid saturating the reception chain and to achieve an optimal signal detection level.

The cutoff frequency Fc of the notch filter 10 according to the invention and/or the target frequency Fw of the band-pass filtering device 50 according to the invention are also easily adjustable and reconfigurable by the generation module 14.

The electronic notch filter 10, and in particular the band-pass filter device 50, also allow filtering with high selectivity to be provided, as shown in FIGS. 7 to 11, the selectivity further being an increasing function of the value of the multiple K.

Furthermore, the band-pass filtering device 50 does not require an input splitter when the band-pass filtering device 50 is used with two separate channels, namely the first channel CH1 and the second channel CH2, due to a sufficiently high input impedance, and, when recombination is done digitally via the generation module 55, it also does not require an output combiner.

The invention claimed is:

1. An electronic band-pass filtering device able to receive an input signal and deliver an output signal having an amplitude, outside a frequency band centered around a target frequency, that is attenuated with respect to that of the input signal, the device comprising:
    a first notch filter, able to receive the input signal and deliver a first filtered signal having an amplitude, at a first cutoff frequency, that is attenuated with respect to that of the input signal, the first cutoff frequency being substantially equal to the target frequency,
    a second notch filter, able to receive the input signal and deliver a second filtered signal having an amplitude, at a second cutoff frequency, that is attenuated with respect to that of the input signal, the second cutoff frequency being distinct from the first cutoff frequency,
    a generation module connected to the output of the first and second notch filters, configured to generate the output signal from a combination of the first and second filtered signals,
    wherein at least one of the first and second notch filters comprises:
        an integration module configured to integrate the input signal during several successive time windows, each time window starting at a respective initial time instant and having a duration substantially equal to the inverse of the cutoff frequency, the initial time instants of at least two distinct windows being separated by a time shift of value greater than or equal to a predefined reference duration, each integration of the input signal during a respective time window resulting in a respective intermediate signal,
        a summing module connected to an output of the integration module and configured to add up the intermediate signals coming from the integration module, the filtered signal depending on the sum of said intermediate signals.

2. The device according to claim 1, wherein each of the first and second notch filters comprises the integration module and the summing module.

3. The device according to claim 1, wherein the integration module is configured to integrate the input signal during No first successive time windows, then during Nb second successive time windows, with No and Nb each being an integer greater than or equal to 2, the initial time instants of the No first windows being all included in a first time period of duration substantially equal to the reference duration, and the initial time instants of the Nb second windows being all subsequent to the first time period.

4. The device according to claim 3, wherein the initial time instants of the No first windows are regularly distributed during the first time period.

5. The device according to claim 3, wherein the initial time instants of the Nb second windows are regularly distributed during a second time period, subsequent to the first time period.

6. The device according to claim 5, wherein the second time period is substantially equal in duration to the reference duration.

7. The device according to claim 1, wherein a transfer function module for integrating the input signal during a respective time window satisfies the following equation:

$$|G(f)| = \frac{\sqrt{2(1-\cos(2\pi f T_{int}))}}{\frac{f}{F_{int}}}$$

where G represents the gain and f the frequency,
$T_{int}$ represents the duration of the respective time window; and
$F_{int}$ satisfies the following equation:

$$F_{int} = \frac{g_m}{2\pi C_{int}}$$

with $g_m$ representing a transconductance of the integration, and,
$C_{int}$ representing a capacitance of the integration.

8. The device according to claim 1, wherein the integration module comprises at least one integration unit, each integration unit being connected to an input of the summing module and configured to perform an integration of the input signal during at least one time window.

9. The device according to claim 8, wherein the integration module comprises multiple integration units arranged in parallel with each other, each of which is configured to perform an integration of the input signal during a respective time window.

10. The device according to claim 1, wherein the summing module is a digital module, and the integration module comprises at least one analog-to-digital converter, the input signal being an analog signal.

11. The device according to claim 8, wherein each integration unit comprises an analog conversion stage, an averaging stage and an analog-to-digital converter.

12. The device according to claim 11, wherein an analog-to-digital converter with successive approximation register forms the averaging stage and the analog-to-digital converter.

13. The device according to claim 1, wherein the integration module and the summing module are each an analog module, the input signal being an analog signal.

14. The device according to claim 1, wherein the second cutoff frequency is substantially equal to two-thirds of the target frequency or substantially equal to twice the target frequency.

15. The device according to claim 1, wherein the predefined reference duration is equal to the inverse of the target frequency.

16. The device according to claim 1, wherein the combination of the first and second filtered signals is a linear combination.

17. The device according to claim 16, wherein the linear combination of the first and second filtered signals satisfies the following equation:

$$Ys = E2 - K \cdot E1$$

where Ys represents the output signal,
E1 represents the first filtered signal,
E2 represents the second filtered signal,
K is an integer greater than or equal to 1.

18. The device according to claim 17, wherein K is a power of 2 and is written as:

$$K = 2^P$$

with P a positive integer.

19. A frequency detection system comprising:
an electronic band-pass filtering device, able to receive an input signal and deliver an output signal having an amplitude, outside a frequency band centered around a target frequency, attenuated with respect to that of the input signal, and
an electronic control device, able to vary the value of the target frequency of the band-pass filtering device until a characteristic frequency of the input signal is detected, the characteristic frequency thus corresponding to the current value of the target frequency,
wherein the electronic band-pass filtering device is according to claim 1.

20. A radio receiver comprising a frequency detection system, wherein the frequency detection system is according to claim 19.

21. An electronic band-pass filtering device, able to receive an input signal and deliver an output signal having an amplitude, outside a frequency band centered around a target frequency, that is attenuated with respect to that of the input signal, the device comprising:
a notch filter, able to receive the input signal and deliver a filtered signal having an amplitude, at a cutoff frequency, attenuated with respect to that of the input signal,
a control module configured to:
control the notch filter with the cutoff frequency equal to one among a first cutoff frequency and a second cutoff frequency, and store one signal obtained among a first filtered signal related to the first cutoff frequency and a second filtered signal related to the second cutoff frequency, the first cutoff frequency being substantially equal to the target frequency, the second cutoff frequency being distinct from the first cutoff frequency, and
then control the notch filter with the cutoff frequency equal to the other one among the first cutoff frequency and the second cutoff frequency, in order to obtain the other signal among the first filtered signal and the second filtered signal,
a generation module, connected to the output of the control module and configured to generate the output signal from a combination of the first and second filtered signals,
wherein the notch filter comprises:
an integration module, configured to integrate of the input signal during several successive time windows, each time window starting at a respective initial time instant and having a duration substantially equal to the inverse of the cutoff frequency, with the initial time instants of at least two distinct windows separated by a time shift of value greater than or equal to a predefined reference duration, each integration of the input signal during a respective time window resulting in a respective intermediate signal,
a summing module, connected to an output of the integration module and configured to add up the intermediate signals coming from the integration module, the filtered signal depending on the sum of said intermediate signals.

22. The device according to claim 21, wherein the integration module is configured to integrate the input signal during No first successive time windows, then during Nb second successive time windows, with No and Nb each being an integer greater than or equal to 2, the initial time instants of the No first windows being all included in a first time period of duration substantially equal to the reference duration, and the initial time instants of the Nb second windows being all subsequent to the first time period.

23. The device according to claim 22, wherein the initial time instants of the No first windows are regularly distributed during the first time period.

24. The device according to claim 22, wherein the initial time instants of the Nb second windows are regularly distributed during a second time period, subsequent to the first time period.

25. The device according to claim 24, wherein the second time period is substantially equal in duration to the reference duration.

26. The device according to claim 21, wherein a transfer function module for integrating the input signal during a respective time window satisfies the following equation:

$$|G(f)| = \frac{\sqrt{2(1 - \cos(2\pi f T_{int}))}}{\frac{f}{F_{int}}}$$

where G represents the gain and f the frequency, $T_{int}$ represents the duration of the respective time window; and $F_{int}$ satisfies the following equation:

$$F_{int} = \frac{g_m}{2\pi C_{int}}$$

with $g_m$ representing a transconductance of the integration, and $C_{int}$ representing a capacitance of the integration.

27. The device according to claim 21, wherein the integration module comprises at least one integration unit, each integration unit being connected to an input of the summing module and configured to perform an integration of the input signal during at least one time window.

28. The device according to claim 27, wherein the integration module comprises multiple integration units arranged in parallel with each other, each of which is configured to perform an integration of the input signal during a respective time window.

29. The device according to claim 21, wherein the summing module is a digital module, and the integration module comprises at least one analog-to-digital converter, the input signal being an analog signal.

30. The device according to claim 27, wherein each integration unit comprises an analog conversion stage, an averaging stage and an analog-to-digital converter.

31. The device according to claim 30, wherein an analog-to-digital converter with successive approximation register forms the averaging stage and the analog-to-digital converter.

32. The device according to claim 21, wherein the integration module and the summing module are each an analog module, the input signal being an analog signal.

33. The device according to claim 21, wherein the second cutoff frequency is substantially equal to two-thirds of the target frequency or substantially equal to twice the target frequency.

34. The device according to claim 21, wherein the predefined reference duration is equal to the inverse of the target frequency.

35. The device according to claim 21, wherein the combination of the first and second filtered signals is a linear combination.

36. The device according to claim 35, wherein the linear combination of the first and second filtered signals satisfies the following equation:

$$Ys = E2 - K - E1$$

where Ys represents the output signal,
E1 represents the first filtered signal,
E2 represents the second filtered signal,
K is an integer greater than or equal to 1.

37. The device according to claim 36, wherein K is a power of 2 and is written as:

$$K = 2^P$$

with P a positive integer.

38. A frequency detection system comprising:
an electronic band-pass filtering device, able to receive an input signal and deliver an output signal having an amplitude, outside a frequency band centered around a target frequency, attenuated with respect to that of the input signal, and
an electronic control device, able to vary the value of the target frequency of the band-pass filtering device until a characteristic frequency of the input signal is detected, the characteristic frequency thus corresponding to the current value of the target frequency,
wherein the electronic band-pass filtering device is according to claim 21.

39. A radio receiver comprising a frequency detection system, wherein the frequency detection system is according to claim 38.

40. A method for processing an input digital signal, the input digital signal being able to be supplied by an analog-to-digital converter connected to the output of a sensor able to receive an input analog signal, the method being implemented by computer and comprising:
a notch filtering the input digital signal into a filtered digital signal, the filtered digital signal having an amplitude, at a cutoff frequency, attenuated with respect to that of the input digital signal,
the notch filtering comprising:
integrating the input digital signal during several successive time windows, each time window starting at a respective initial time instant and having a duration substantially equal to the inverse of the cutoff frequency, the initial time instants of at least two distinct windows being separated by a time shift of value greater than or equal to a predefined reference duration, each integration of the input digital signal during a respective time window resulting in a respective intermediate digital signal, and
summing of the intermediate digital signals, the filtered digital signal depending on the sum of said intermediate digital signals;

wherein the method comprises a band-pass filtering for filtering the input digital signal into an output digital signal, the output digital signal having an amplitude, outside a frequency band centered around a target frequency, that is attenuated with respect to that of the input digital signal, the band-pass filtering comprising:

an initial implementation of the notch filtering with the cutoff frequency equal to one among a first cutoff frequency and a second cutoff frequency, the first cutoff frequency being substantially equal to the target frequency the second cutoff frequency being distinct from the first cutoff frequency;

storing the signal obtained among a first filtered digital signal related to the first cutoff frequency and a second filtered digital signal related to the second cutoff frequency, and a subsequent implementation of the notch filtering with the cutoff frequency equal to the other one among the first cutoff frequency and the second cutoff frequency, in order to obtain the other signal among the first filtered digital signal and the second filtered digital signal;

generating the output digital signal from a combination of the first and second filtered digital signals.

41. The method according to claim 40, wherein the method comprises multiple iterations of the band-pass filtering for different successive values of the target frequency until a characteristic frequency of the input signal is detected, the characteristic frequency thus corresponding to a current value of the target frequency.

* * * * *